(12) United States Patent
Jung et al.

(10) Patent No.: US 11,843,882 B2
(45) Date of Patent: Dec. 12, 2023

(54) IMAGE SENSOR FOR COMPENSATING FOR SIGNAL DIFFERENCE BETWEEN PIXELS

(71) Applicant: SAMSUNG ELECTRONICS CO., LTD., Suwon-si (KR)

(72) Inventors: Tae Sub Jung, Yongin-si (KR); Dong Min Keum, Yongin-si (KR); Bum Suk Kim, Yongin-si (KR); Jung Saeng Kim, Yongin-si (KR); Jong Hoon Park, Yongin-si (KR); Min Jang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 119 days.

(21) Appl. No.: 17/406,700

(22) Filed: Aug. 19, 2021

(65) Prior Publication Data

US 2021/0385400 A1    Dec. 9, 2021

Related U.S. Application Data

(63) Continuation of application No. 17/008,797, filed on Sep. 1, 2020, now abandoned, which is a continuation
(Continued)

(30) Foreign Application Priority Data

Aug. 10, 2017    (KR) .......................... 10-2017-0101639

(51) Int. Cl.
*H01L 27/146* (2006.01)
*H04N 25/702* (2023.01)
(Continued)

(52) U.S. Cl.
CPC ..... *H04N 25/702* (2023.01); *H01L 27/14605* (2013.01); *H01L 27/14621* (2013.01);
(Continued)

(58) Field of Classification Search
CPC ......................................... H01L 27/146–14698
See application file for complete search history.

(56) References Cited

U.S. PATENT DOCUMENTS 9,450,005 B2    9/2016    Yanagita et al.
9,521,341 B2    12/2016    Shim et al.
(Continued)

FOREIGN PATENT DOCUMENTS

CN    1877867    12/2006
JP    4957413    3/2012
(Continued)

OTHER PUBLICATIONS

Office Action dated Mar. 30, 2022 in corresponding U.S. Appl. No. 17/008,797.
(Continued)

*Primary Examiner* — Bryan R Junge
(74) *Attorney, Agent, or Firm* — F. Chau & Associates, LLC

(57) ABSTRACT

An image sensor includes two or more phase-difference detection pixels disposed adjacent to each other, a plurality of general pixels spaced apart from the phase-difference detection pixels, first and second peripheral pixels, and first to third light shields. The first and second peripheral pixels are adjacent to the phase-difference detection pixels, and between the phase-difference detection pixels and the general pixels. The first light shield is disposed in one of the general pixels and has a first width. The second light shield extends into the first peripheral pixel from a first area between the phase-difference detection pixels and the first peripheral pixel, and has a second width different from the first width. The third light shield extends into the second peripheral pixel from a second area between the phase-
(Continued)

difference detection pixels and the second peripheral pixel, and has a third width different from the first width.

19 Claims, 25 Drawing Sheets

Related U.S. Application Data of application No. 16/426,445, filed on May 30, 2019, now Pat. No. 10,819,929, which is a continuation of application No. 15/948,756, filed on Apr. 9, 2018, now Pat. No. 10,341,595.

(51) Int. Cl.
  *H04N 25/76* (2023.01)
  *H04N 25/704* (2023.01)

(52) U.S. Cl.
  CPC .. *H01L 27/14623* (2013.01); *H01L 27/14645* (2013.01); *H04N 25/704* (2023.01); *H04N 25/76* (2023.01); *H01L 27/1463* (2013.01); *H01L 27/1464* (2013.01); *H01L 27/14627* (2013.01); *H01L 27/14636* (2013.01)

(56) References Cited

U.S. PATENT DOCUMENTS

| | | | |
|---|---|---|---|
| 9,842,874 B2 | 12/2017 | Nakata | |
| 10,341,595 B2 | 7/2019 | Jung et al. | |
| 10,819,929 B2 | 10/2020 | Jung et al. | |
| 2006/0278948 A1 | 12/2006 | Yamaguchi et al. | |
| 2008/0173903 A1* | 7/2008 | Imai | H01L 27/14625 |
| | | | 257/E31.127 |
| 2009/0218479 A1 | 9/2009 | Arishima et al. | |
| 2013/0194471 A1 | 8/2013 | Yamashita | |
| 2014/0307139 A1 | 10/2014 | Tanaka et al. | |
| 2015/0015749 A1 | 1/2015 | Ito | |
| 2015/0076643 A1* | 3/2015 | Kikuchi | H01L 27/14685 |
| | | | 438/73 |
| 2015/0236066 A1* | 8/2015 | Tayanaka | H01L 27/14623 |
| | | | 438/69 |
| 2015/0373255 A1 | 12/2015 | Kim et al. | |
| 2016/0021320 A1 | 1/2016 | Pyeoun | |
| 2016/0088245 A1 | 3/2016 | Nakatu et al. | |
| 2016/0276396 A1 | 9/2016 | Tayanaka et al. | |
| 2016/0343753 A1 | 11/2016 | Asatsuma | |
| 2016/0366355 A1 | 12/2016 | Kato | |
| 2017/0118398 A1 | 4/2017 | Sano | |
| 2017/0366770 A1* | 12/2017 | Yokogawa | H01L 27/14623 |
| 2018/0166487 A1 | 6/2018 | Noudo | |
| 2019/0052823 A1 | 2/2019 | Jung et al. | |
| 2019/0238773 A1 | 8/2019 | Tsuzuki et al. | |
| 2019/0281240 A1 | 9/2019 | Jung et al. | |
| 2020/0235149 A1* | 7/2020 | Shiraishi | H01L 27/14612 |
| 2020/0404203 A1 | 12/2020 | Jung et al. | |
| 2021/0143196 A1 | 5/2021 | Uchida et al. | |

FOREIGN PATENT DOCUMENTS

| | | |
|---|---|---|
| JP | 2016029674 | 3/2016 |
| JP | 2016096234 | 5/2016 |
| JP | 6017322 | 10/2016 |
| KR | 10-2016-0000044 | 1/2016 |
| KR | 1020160034255 | 3/2016 |
| KR | 10-2016-0097121 | 8/2016 |
| WO | 2016098640 | 6/2016 |
| WO | 2016194501 | 8/2016 |

OTHER PUBLICATIONS

Notice of Allowance dated Feb. 21, 2019 in Related U.S. Appl. No. 15/948,756.
Notice of Allowance dated Jul. 22, 2020 in Related U.S. Appl. No. 16/426,445.
Office Action dated Oct. 30, 2018 in Related U.S. Appl. No. 15/948,756.
Office Action dated Mar. 28, 2023 in corresponding Application No. CN 201810840647.3.

* cited by examiner

IMAGE SENSOR FOR COMPENSATING FOR SIGNAL DIFFERENCE BETWEEN PIXELS

CROSS-REFERENCE TO RELATED APPLICATIONS

This U.S. non-provisional patent application is a continuation application of U.S. patent application Ser. No. 17/008,797 filed Sep. 1, 2020, which is a continuation application of U.S. patent application Ser. No. 16/426,445 filed May 30, 2019, which issued as U.S. Pat. No. 10,819,929 on Oct. 27, 2020, which is a continuation application of U.S. patent application Ser. No. 15/948,756, filed on Apr. 9, 2018, which issued as U.S. Pat. No. 10,341,595 on Jul. 2, 2019, which claims priority under 35 U.S.C. § 119 to Korean Patent Application No. 10-2017-0101639, filed on Aug. 10, 2017, the disclosures of which are incorporated by reference herein in their entireties.

TECHNICAL FIELD

Exemplary embodiments of the present disclosure relate to an image sensor for compensating for a signal difference between pixels.

DISCUSSION OF THE RELATED ART

Image sensors may have a phase-difference detection autofocus (PDAF) function which analyzes contrast of an acquired image, and automatically adjusts a focus of an image sensor. A method of replacing some pixels with phase-difference detection pixels may be used in an image sensor. Phase-difference detection pixels include phase-difference detection sensors, and as a result, an amount of transmission of light incident on the phase-difference detection pixels may be different from that of light incident on imaging pixels. Thus, the amount of transmission of light incident on peripheral pixels is affected by the amount of transmission of light incident on the phase-difference detection pixels. The quality of an image may be degraded by a signal difference due to different amounts of transmission of light incident on imaging pixels, which are adjacent to phase-difference detection pixels, and other imaging pixels.

SUMMARY OF THE INVENTION

Exemplary embodiments of the present disclosure are directed to providing an image sensor including a unit pixel array that compensates for a change in signals of peripheral pixels disposed adjacent to phase-difference detection pixels.

According to an exemplary embodiment of the present disclosure, an image sensor includes two or more phase-difference detection pixels disposed adjacent to each other, a plurality of general pixels spaced apart from the phase-difference detection pixels, first and second peripheral pixels, and first to third light shields. The first peripheral pixel and the second peripheral pixel are adjacent to the phase-difference detection pixels, and between the phase-difference detection pixels and the general pixels. The first light shield is disposed in one of the general pixels and has a first width. The second light shield extends into the first peripheral pixel from a first area between the phase-difference detection pixels and the first peripheral pixel, and has a second width different from the first width. The third light shield extends into the second peripheral pixel from a second area between the phase-difference detection pixels and the second peripheral pixel, and has a third width different from the first width.

According to an exemplary embodiment of the present disclosure, an image sensor includes two or more phase-difference detection pixels disposed adjacent to each other, a plurality of general pixels spaced apart from the phase-difference detection pixels, first and second peripheral pixels, a first light shield, a plurality of second light shields, and a plurality of third light shields. The first peripheral pixel and the second peripheral pixel are adjacent to the phase-difference detection pixels, and between the phase-difference detection pixels and the general pixels. The first light shield is disposed in one of the general pixels and has a first width. The plurality of second light shields extend into the first peripheral pixel from a first area between the first peripheral pixel and first additional pixels adjacent to the first peripheral pixel, and have a second width different from the first width. The plurality of third light shields extend into the second peripheral pixel from a second area between the second peripheral pixel and second additional pixels adjacent to the second peripheral pixel, and have a third width different from the first width.

According to an exemplary embodiment of the present disclosure, an image sensor includes a unit pixel array having a plurality of pixels. The image sensor includes two or more phase-difference detection pixels disposed adjacent to each other, a plurality of general pixels spaced apart from the phase-difference detection pixels and including a first light shield having a first width, and two or more peripheral pixels adjacent to the phase-difference detection pixels. The two or more peripheral pixels include a second light shield having a second width different from the first width at one or more boundaries from among boundaries between the two or more peripheral pixels and the phase-difference detection pixels, the general pixels, and additional peripheral pixels adjacent to the two or more peripheral pixels.

According to an exemplary embodiment of the present disclosure, an image sensor includes a first phase-difference detection pixel including a first light shield having a first width, a second phase-difference detection pixel disposed adjacent to the first phase-difference detection pixel and including a second light shield having the first width, a first peripheral pixel disposed adjacent to the first phase-difference detection pixel and including a third light shield having a second width different from the first width, and a second peripheral pixel disposed adjacent to the second phase-difference detection pixel and including a fourth light shield having the second width. The first and second phase-difference detection pixels include a phase-difference detection sensor.

BRIEF DESCRIPTION OF THE DRAWINGS

The above and other features of the present disclosure will become more apparent to those of ordinary skill in the art by describing in detail exemplary embodiments thereof with reference to the accompanying drawings, in which.

DETAILED DESCRIPTION OF THE EXEMPLARY EMBODIMENTS

Figure 1:
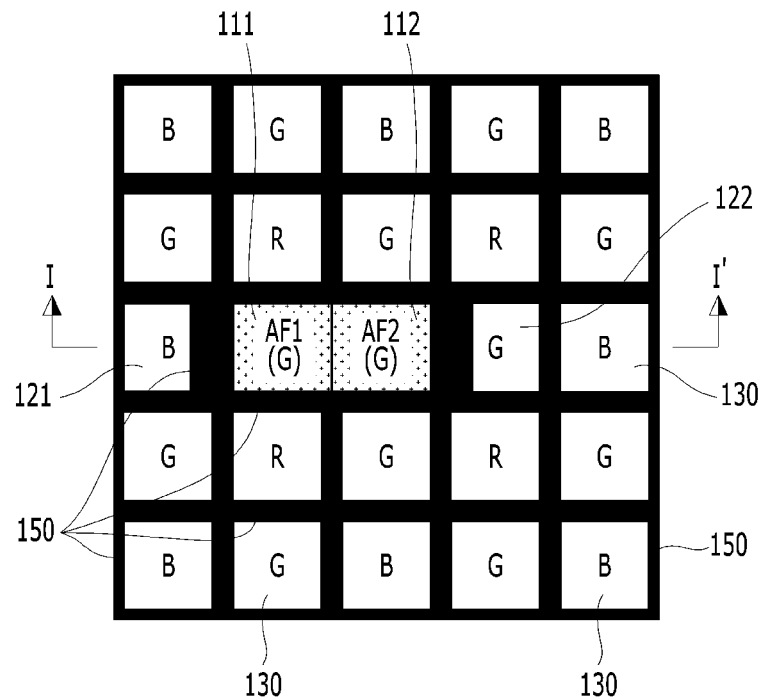
FIGS. 1, 3, 4, 5, 7, 9, 11, 13, 15, 17, 19, 20, 24 to 33, 37, and 42 are views illustrating unit pixel arrays according to exemplary embodiments of the present disclosure.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc., are used herein to distinguish one element from another, and the elements are not limited by these terms. Thus, a "first" element in an exemplary embodiment may be described as a "second" element in another exemplary embodiment. Further, when one value (e.g., a thickness) is described as being about equal to or about the same as another value, it is to be understood that the values are equal to each other within a measurement error, or if measurably unequal, are close enough in value to be functionally equal to each other as would be understood by a person having ordinary skill in the art.

A complementary metal-oxide semiconductor (CMOS) image sensor may include a unit pixel array and a logic circuit. The unit pixel array performs photoelectric transformation on incident light to generate a voltage signal, and the logic circuit processes and outputs the voltage signal. The unit pixel array may be formed by arranging tetragonal unit pixels in a lattice form.

The unit pixel array of the CMOS image sensor may include a color filter layer and a microlens layer disposed on a photoelectric transformation layer that includes photodiodes. Incident light collected through the microlens layer is filtered through the color filter layer, and only optical signals having frequencies in a predetermined range pass through the photoelectric transformation layer. The photoelectric transformation layer may be a substrate including photo detecting devices such as, for example, photodiodes. The photo detecting device determines light intensity in each frequency band and obtains color image data (e.g., red (R), green (G), and blue (B) data) from the intensity.

The CMOS image sensor may have a phase-difference detection autofocus (PDAF) function. Some of the unit pixels in the CMOS image sensor may be phase-difference detection pixels used for autofocusing. Imaging pixels adjacent to the phase-difference detection pixels are referred to as peripheral pixels. Imaging pixels not adjacent to the phase-difference detection pixels are referred to as general pixels. The phase-difference detection pixel may be distributed at a ratio of 1/16, 1/32, 1/64, etc. of the total number of pixels. A phase-difference detection pixel is a pixel that includes a phase-difference detection sensor, unlike a peripheral pixels and general pixels. A moving direction and distance of a lens of an imaging device may be calculated by analyzing a phase difference of image data obtained from photodiodes of the phase-difference detection pixels.

Hereinafter, unit pixel arrays of an image sensor according to exemplary embodiments of the present disclosure will be described with reference to the accompanying drawings.

Figure 2:
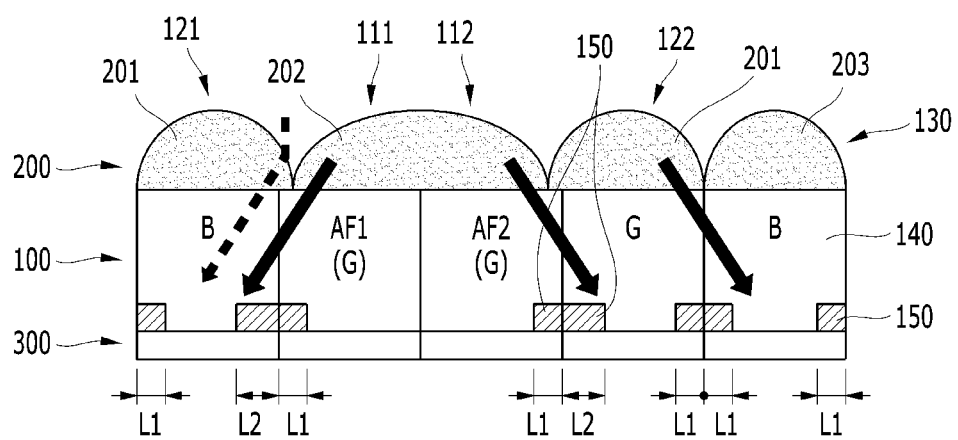
FIGS. 2, 6, 8, 10, 12, 14, 16, 18, 21 to 23, 34 to 36, 38 to 41, and 43 to 48 are views illustrating cross-sectional structures of the unit pixel arrays according to exemplary embodiments of the present disclosure.

FIG. 1 is a view illustrating a unit pixel array according to an exemplary embodiment of the present disclosure. FIG. 2 is a view taken along line I-I' of FIG. 1 and illustrating a cross-sectional structure of the unit pixel array according to an exemplary embodiment of the present disclosure.

The unit pixel array according to the exemplary embodiment of the present disclosure will be described with reference to the drawing including a unit pixel array having 5×5 pixels. However, exemplary embodiments of the present disclosure are not limited thereto. For example, exemplary embodiments may include a unit pixel array having a different number of pixels.

Referring to FIG. 1, some pixels in the unit pixel array may be phase-difference detection pixels AF. Two adjacent pixels may be a pair of phase-difference detection pixels AF1 and AF2. Two phase-difference detection pixels belonging to a pair are adjacent to each other, have one side thereof in common, and may be disposed to be vertically or laterally adjacent to each other in a lattice pixel array. One pixel of the two adjacent pixels refers to a first phase-difference detection pixel AF1 or 111, and the other pixel thereof refers to a second phase-difference detection pixel AF2 or 112. According to exemplary embodiments, the two phase-difference detection pixels AF1 and AF2 may be directly adjacent to each other (e.g., they may be described as having one side thereof in common, or as including two sides that directly contact each other), or the two phase-difference detection pixels AF1 and AF2 may be indirectly adjacent to each other and have intervening elements (e.g., other pixels) disposed therebetween.

Imaging pixels, which are disposed adjacent to one of the first phase-difference detection pixel 111 and the second phase-difference detection pixel 112, refer to peripheral pixels. The peripheral pixels may be disposed to be in contact with one side of the first or second phase-difference detection pixels 111 and 112. The peripheral pixels may be pixels laterally and vertically disposed from the first or the second phase-difference detection pixel 111 or 112. As shown in the exemplary embodiment of FIG. 1, the peripheral pixel disposed at a left side of the first phase-difference detection pixel 111 is a left peripheral pixel 121, and the peripheral pixel disposed at a right side of the second phase-difference detection pixel 112 is a right peripheral pixel 122.

When one side is disposed to be in contact with the phase-difference detection pixel and the peripheral pixel, the one side in contact with both the pixels is referred to as an adjacent side of the peripheral pixel. The peripheral pixels may be pixels diagonally disposed from the phase-difference detection pixels 111 and 112. The peripheral pixels refer to pixels at locations at which an amount of received light thereof is changed due to an influence of the phase-difference detection pixels AF1 and AF2.

General pixels 130 refer to pixels at locations at which an amount of received light thereof is not changed due to the influence of the phase-difference detection pixels AF1 and AF2. That is, regardless of the influence of the phase-difference detection pixels AF1 and AF2, an amount of received light at the general pixels 130 is not changed, unlike the peripheral pixels. For example, imaging pixels excluding the first phase-difference detection pixel 111, the second phase-difference detection pixel 112, the left peripheral pixel 121, and the right peripheral pixel 122 are the general pixels 130, and the amount of received light at these pixels is not affected by the phase-difference detection pixels AF1 and AF2.

Referring to FIG. 2, the unit pixel array may include a color filter layer 100, a microlens layer 200, and a photoelectric transformation layer 300. One photodiode of the photoelectric transformation layer 300 may correspond to each pixel. The color filter layer 100 and the microlens layer 200 may be stacked on the photoelectric transformation layer 300.

The color filter layer 100 may be formed as a color filter array and may include color filters 140 and light shields 150. A Bayer arrangement including red (R), green (G), and blue (B) may be applied as the color filter array. However, exemplary embodiments of the present disclosure are not limited thereto, and the color filter array may be used with a different arrangement. One filter among R, G, and B filters arranged by the Bayer arrangement may be included in the first phase-difference detection pixel 111 and the second phase-difference detection pixel 112. For example, the first phase-difference detection pixel 111 may include a B filter, and the second phase-difference detection pixel 112 may include a G filter. The first phase-difference detection pixel 111 and the second phase-difference detection pixel 112 may have the same color filter. For example, both phase-difference detection pixels 111 and 112 forming a pair may have G filters. The color filter array may be based on a complementary color system (e.g., a system using magenta, green, cyan, and yellow).

The pair of phase-difference detection pixels 111 and 112 disposed adjacent to each other may use the same color filters 140, e.g., G filters. When both the first and second phase-difference detection pixels 111 and 112 include the G filters, defective pixel correction of the color filter layer 100 may be efficiently performed.

The color filters 140 included in the phase-difference detection pixels 111 and 112 may be disposed for convenience of a process of manufacturing a color filter array in addition to having a purpose of color implementation. For example, the phase-difference detection pixels 111 and 112 may not include the color filters 140 and may include white (W) filters or transparent filters. When the phase-difference detection pixels 111 and 112 use the W filters, an amount of received light thereof may be increased. As the amount of received light of the phase-difference detection pixels 111 and 112 is increased, an amount of received light of the peripheral pixel may be affected by scattering and dispersing subject light. Even when the G filters are disposed in both phase-difference detection pixels 111 and 112 belonging to a pair, since an amount of received light of the G filter is greater than that of another color filter(s), the amount of received light of the peripheral pixel may be affected by the pair of phase-difference detection pixels 111 and 112. For example, the amount of received light of the peripheral pixels 121 and 122 adjacent to the phase-difference detection pixels 111 and 112 may be greater than that of the general pixels 130 including color filters having the same wavelengths as the peripheral pixels 121 and 122. When the amount of received light is changed, amplitudes of signals of the peripheral pixel and the general pixel 130 are different, and thus, the quality of an image may be degraded.

The light shields 150 may be provided at boundaries between the pixels to prevent light incident on each of the pixels from being transmitted to the photoelectric transformation layer 300 of other pixels. The light shield 150 may block subject light from passing through the color filter 140 and being transmitted to the photoelectric transformation layer 300. For example, the light shield 150 may be formed of an opaque metal. The light shields 150 may be formed in a lattice shape along the boundaries between the pixels. The light shields 150 may be formed to have the same width in a direction toward each pixel from a boundary between adjacent pixels. The light shield 150 may be integrally formed by a patterning process.

The microlens layer 200 may be disposed on the color filter layer 100, and a microlens may be disposed to correspond to each pixel. As shown in FIG. 2, microlenses 203 including a lower portion having the same area as an upper portion of a general pixel may be disposed on the general pixels 130. The microlens 201 may be disposed on each of the left peripheral pixel 121 and the right peripheral pixel 122. One microlens 202 may be disposed on the pair of phase-difference detection pixels 111 and 112. For example, the one microlens 202 may be shared by the adjacent phase-difference detection pixels 111 and 112. A size of the microlens 202 disposed on the pair of phase-difference detection pixels 111 and 112 may be smaller than that of an upper portion area of the pair of phase-difference detection pixels 111 and 112. For example, as shown in FIG. 2, the size of the portion of the microlens 202 that contacts the upper portion area of the pair of phase-difference detection pixels 111 and 112 may be smaller than the size of the upper portion area of the pair of phase-difference detection pixels 111 and 112. For example, in an exemplary embodiment, the boundary of the upper portion area of the pair of phase-difference detection pixels 111 and 112 may expand beyond the boundary of the portion of the microlens 202 that contacts the pair of phase-difference detection pixels 111 and 112.

The microlens 201 disposed on each of the peripheral pixels 121 and 122 of the pair of phase-difference detection pixels 111 and 112 may have a size expanding in a direction toward the phase-difference detection pixels 111 and 112. For example, as shown in FIG. 2, in an exemplary embodiment, the microlens 202 disposed on the pair of phase-difference detection pixels 111 and 112 does not cover the entirety of the pair of phase-difference detection pixels 111 and 112, and the microlens 201 disposed on each of the peripheral pixels 121 and 122 extends onto the pair of phase-difference detection pixels 111 and 112 in the area not covered by the microlens 202. The microlenses 201, 202, and 203 may be on-chip lenses. According to the exemplary embodiment of the present disclosure shown in FIGS. 1 and 2, a phase difference may be detected by a shared-on-chip lens method.

As denoted by arrows in FIG. 2, light passing through the one microlens 202 may pass through each of the first and second phase-difference detection pixels 111 and 112 and may be incident on the photoelectric transformation layer 300 of the first and second phase-difference detection pixels 111 and 112. An autofocus function may be performed by detecting a phase difference of the photoelectric transformation layer 300 of each of the phase-difference detection pixels 111 and 112 forming a pair and moving a location of an imaging lens of an image sensor.

In exemplary embodiments, even when the one microlens 202 having a size corresponding to two pixels is formed, the size of the microlens 202 may not exactly correspond to the size of two microlenses 203 in some cases. For example, as shown in the exemplary embodiment of FIG. 2, a planar size of the microlens 202 may be smaller than a size of upper surfaces of the pair of phase-difference detection pixels 111 and 112. For example, the portion of the microlens 202 that contacts the upper surfaces of the pair of phase-difference detection pixels 111 and 112 may be smaller than the upper surfaces of the pair of phase-difference detection pixels 111 and 112. A planar size of each of the microlenses 201 and 201 of the peripheral pixels 121 and 122 may be greater than a size of an upper surface of each of the peripheral pixels 121 and 122. For example, the portion of each of the microlenses 201 and 201 that contacts the upper surface of each of the peripheral pixels 121 and 122 may be greater than the upper surface of each of the peripheral pixels 121 and 122, and may extend onto the upper surfaces of the pair of phase-difference detection pixels 111 and 112. Since the microlenses 201 and 202 have different sizes and thus have different locations on the color filter layer 100, an amount of received light of the peripheral pixel may be increased. Due to a signal difference between the peripheral pixels 121 and 122 and the general pixels 130, the quality of an image may be degraded. For example, the microlens 201 included in the left peripheral pixel 121 of FIG. 2 is disposed to protrude toward and onto the first phase-difference detection pixel 111. Some light incident on a left upper end of the first phase-difference detection pixel 111 may be collected through the microlens 201, as denoted by the dotted line arrow, and may be incident on the left peripheral pixel 121. An amount of received light of the left peripheral pixel 121 becomes greater than an amount of received light of the general pixel 130, and thus, a signal difference may occur between pixels having the same color filter.

When the phase-difference detection pixels are located at an edge of the pixel arrays, an incidence angle of light transmitted from an imaging lens may be increased. In the case in which the peripheral pixel 121 is disposed at the edge of the pixel arrays, a size of the microlens 201 may expand toward the phase-difference detection pixels 111 and 112. In this case, a location of the microlens 201 on the peripheral pixel 121 may also be moved toward the phase-difference detection pixels 111 and 112. In such a structure, an amount of received light of the peripheral pixel 121 may be significantly increased due to the size and location of the microlens 201 on the peripheral pixel 121 and an incidence angle of light passing through the imaging lens. Further, since a signal of the peripheral pixel 121 is different from a signal of the general pixel 130, the quality of an image may be degraded.

According to an exemplary embodiment of the present disclosure, the amount of received light of the peripheral pixel 121 may be adjusted by increasing or decreasing a width of each of the light shields 150 disposed at the adjacent sides which are boundaries of the phase-difference detection pixels 111 and 112.

Referring to FIG. 1, in the unit pixel array having 5×5 pixels, a pixel at a third row and a second column and a pixel at the third row and a third column form the pair of phase-difference detection pixels 111 and 112. The pixel at the third row and the second column refers to the first phase-difference detection pixel 111, and the pixel at the third row and the third column refers to the second phase-difference detection pixel 112. A pixel at the third row and a first column disposed at a left side of the first phase-difference detection pixel 111 refers to the left peripheral pixel 121. A pixel at the third row and a fourth column disposed at a right side of the second phase-difference detection pixel 112 refers to the right peripheral pixel 122. The left peripheral pixel 121 may include a B filter, and the right peripheral pixel 122 may include a G filter. Each of the first phase-difference detection pixel 111 and the second phase-difference detection pixel 112 may include G filters. In an exemplary embodiment, the light shield 150 is not disposed between the first phase-difference detection pixel 111 and the second phase-difference detection pixel 112.

When an amount of received light of the phase-difference detection pixels 111 and 112 is greater or smaller than that of the general pixel 130, an amount of received light of the peripheral pixels 121 and 122 affected by the phase-difference detection pixels 111 and 112 may be compensated for by increasing or decreasing a width of some of the light shields 150 disposed at the peripheral pixels 121 and 122. For example, as shown in FIG. 1, an extending width of the light shield 150 at the adjacent side of each of the left peripheral pixel 121 and the right peripheral pixel 122 may be adjusted. When each of the pixels is assumed to have a square shape, the width of the light shield 150 of the adjacent side, which is in contact with the phase-difference detection pixels 111 and 112, from among four sides forming outer sides of each peripheral pixel 121 and 122, may be set to be greater than the width of the light shield 150 disposed at each of the other pixels or sides. When the width of the light shield 150 is increased, light scattered or dispersed by the phase-difference detection pixels 111 and 112 can be prevented from being transmitted to the peripheral pixels 121 and 122 adjacent to the phase-difference detection pixels 111 and 112. In addition, an increase in the amount of light received by the peripheral pixels 121 and 122 can be suppressed by scattering or dispersing light incident on the phase-difference detection pixels 111 and 112.

Referring to FIG. 2, which is a cross-sectional view taken along line I-I' of FIG. 1, a width L1 of each of the light shields 150 extending in the general pixel 130 and the phase-difference detection pixels 111 and 112 from boundaries between the general and phase-difference detection pixels 130, 111, and 112 and pixels adjacent thereto may be constant. The width L1 refers to a reference width. The width of the light shield 150 of each of the peripheral pixels 121 and 122 may be adjusted by increasing or decreasing the reference width L1. For example, as shown in FIG. 2, a width L2 of the light shield 150 extending in the left peripheral pixel 121 from the adjacent side, which is a boundary between the left peripheral pixel 121 and the first phase-difference detection pixel 111, may be greater than the reference width L1, which is the width of the light shield 150 of the general pixel 130. The width L2 of the light shield 150 extending in the right peripheral pixel 122 from the adjacent side between the right peripheral pixel 122 and the second phase-difference detection pixel 112 may also be greater than the reference width L1.

Referring to FIG. 2, in an exemplary embodiment, when the width of the light shield 150 of the adjacent side of the left peripheral pixel 121 is the reference width L1, light scattered or dispersed by the first phase-difference detection pixel 111 is not blocked by the light shield 150 of the adjacent side of the left peripheral pixel 121. The light scattered or dispersed by the first phase-difference detection pixel 111 may be collected in the color filter layer 100 of the left peripheral pixel 121. When the width L2 of the light shield 150 of the adjacent side of the left peripheral pixel 121 is increased to be greater than the reference width L1, the amount of light received by the left peripheral pixel 121 may be decreased because the light may be further blocked due to an increased width L2-L1. The general pixel 130, through which the same wavelength as a wavelength passing through the left peripheral pixel 121 passes, is disposed at the third row and a fifth column of the pixel array of FIG. 1. The general pixel 130 at the third row and the fifth column is not affected by the phase-difference detection pixels 111 and 112. The peripheral pixels 121 and 122 may be controlled to have the same light-receiving rate as the general pixel 130 at the third row and the fifth column by adjusting the width of the light shield 150 of the adjacent side of the left peripheral pixel 121. Since the light-receiving rates of peripheral pixels 121 and 122 and the general pixel 130 are controlled to be the same, quality degradation of an image due to a signal difference between pixels having the same wavelength can be prevented or reduced.

Referring to FIGS. 1 and 2, in an exemplary embodiment, two phase-difference detection pixels 111 and 112 are disposed adjacent to each other. In an exemplary embodiment, more than two phase-difference detection pixels may be disposed adjacent to each other. A plurality of general pixels 130 is spaced apart from the phase-difference detection pixels 111 and 112. A first peripheral pixel 121 and a second peripheral pixel 122 are disposed adjacent to the phase-difference detection pixels 111 and 112, and between the phase-difference detection pixels 111 and 112 and the general pixels 130.

A first light shield 150 is disposed in one of the general pixels 130. The first light shield 150 disposed in the one of the general pixels 150 has a first width L1. A second light shield 150 extends into the first peripheral pixel 121 from a first area between the phase-difference detection pixels 111 and 112 and the first peripheral pixel 121. The second light shield 150 extending into the first peripheral pixel 121 has a second width L2 different from the first width L1. A third light shield 150 extends into the second peripheral pixel 122 from a second area between the phase-difference detection pixels 111 and 112 and the second peripheral pixel 122. The third light shield 150 extending into the second peripheral pixel 122 has a third width.

Since the second width of the second light shield 150 extending into the first peripheral pixel 121 and the third width of the third light shield 150 extending into the second peripheral pixel 122 are substantially equal to each other in the exemplary embodiment of FIGS. 1 and 2, both the second and third widths are represented by L2 in FIG. 2. However, exemplary embodiments are not limited thereto. For example, as will be detailed in the exemplary embodiments described below and shown in the accompanying figures, in addition to the second and third widths being substantially equal to each other, according to exemplary embodiments, each of the second width and the third width may be greater than the first width, each of the second width and the third width may be smaller than the first width, the second width may be different from the third width, each of the second width and the third width may be greater than the first width, each of the second width and the third width may be smaller than the first width, and the second width may be greater than the first width and the third width may be smaller than the first width.

Figure 3:
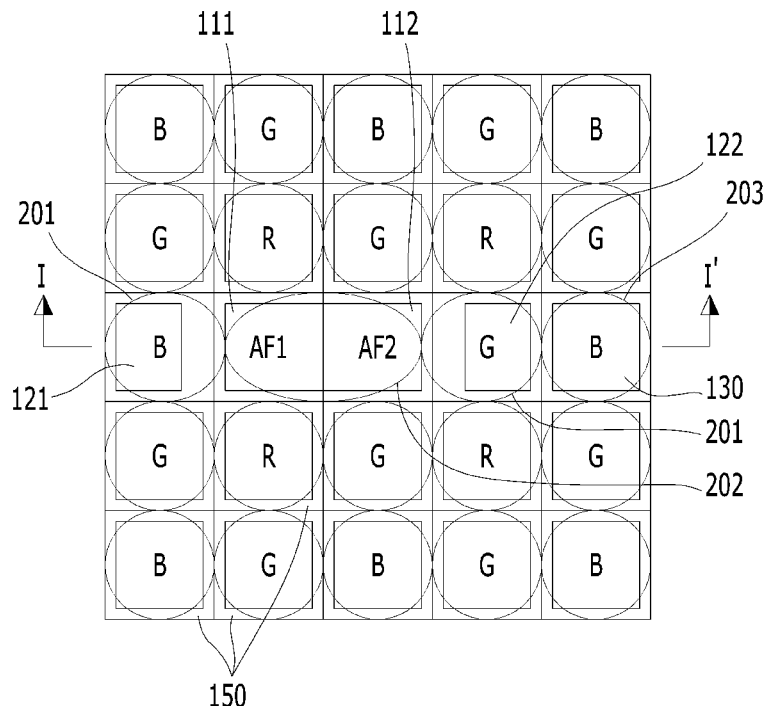
Figure 4:
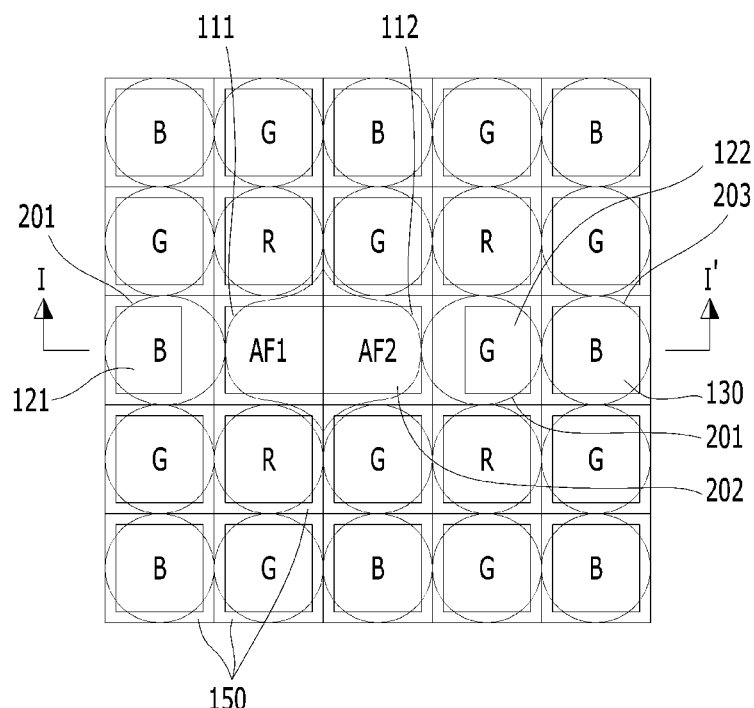

FIGS. 3 and 4 are views illustrating shapes of microlenses 201, 202, and 203 of a unit pixel array according to an exemplary embodiment of the present disclosure.

The shapes of the microlenses may be different according to an arrangement of phase-difference detection pixels 111 and 112, materials of the microlenses 201, 202, and 203, an annealing temperature, etc. A light-receiving rate of a peripheral pixel may be changed by the shape of the microlens. For example, a microlens layer 200 may be formed on a color filter layer 100 of the unit pixel array, as shown in FIG. 2. The microlenses 201, 202, and 203 included in the microlens layer 200 may have various shapes including a convex portion. When the phase-difference detection pixels 111 and 112 adjacent to each other and belonging to a pair share one microlens 202, the microlens 202 may have a part of an oblong elliptical shape according to a shape of the pair of phase-difference detection pixels 111 and 112. For example, the microlens 202 may have an elongated oval shape that spans the pair of phase-difference detection pixels 111 and 112.

Referring to FIG. 3, the microlens 202 corresponding to the pair of phase-difference detection pixels 111 and 112 may have an elliptical cut surface. Sizes in direction of long and short axes of the elliptical shape may be decreased according to, for example, a surface tension of silicon dioxide ($SiO_2$), which is a material that may be used to form the microlens. Sizes of the microlenses 201 of peripheral pixels 121 and 122 may be increased toward adjacent sides thereof according to a change in size of the microlens 202 disposed on the pair of phase-difference detection pixels 111 and 112.

Referring to FIG. 4, a size of the one microlens 202 formed on the pair of phase-difference detection pixels 111 and 112 may expand toward a space between the one microlens 202 and a pixel adjacent thereto, or a location thereof may be moved toward the space.

Since a curvature of the one microlens 202 formed on the pair of phase-difference detection pixels 111 and 112 increases as a width in a long axis direction thereof decreases, an autofocus characteristic thereof can be improved. The sizes of the microlenses 201 on the peripheral pixels 121 and 122 adjacent to the phase-difference detection pixels 111 and 112 in the long axis direction may expand toward the adjacent sides thereof. When the size of the microlens increases, an amount of light received thereby increases, and thus a width of a light shield 150 of the adjacent side may increase. The width of the light shield 150 of the adjacent side may be set to be greater than a reference width L1, which is a width of a light shield 150 of a general pixel 130.

Hereinafter, for convenience of explanation, a further description of elements previously described with reference to FIGS. 1 and 2 may be omitted.

Figure 5:
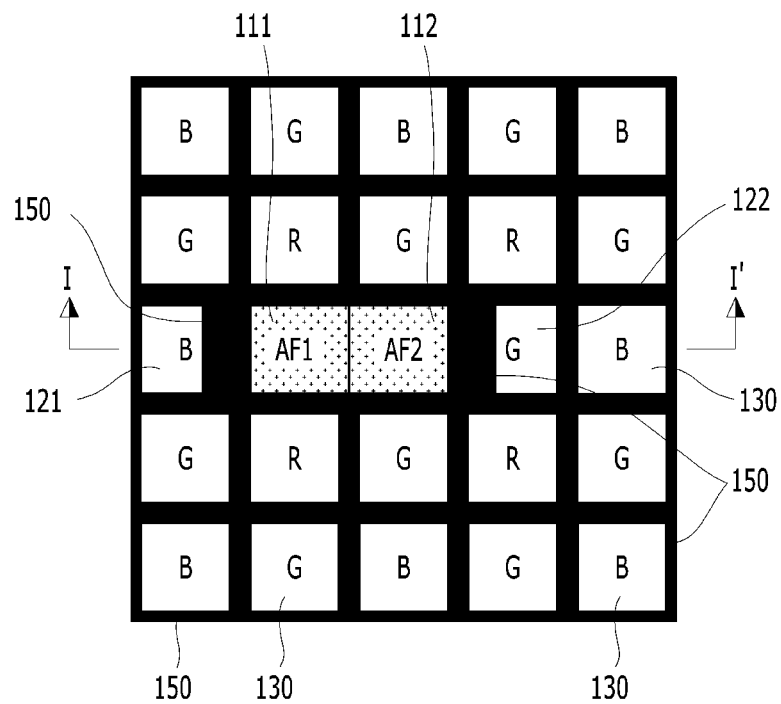
Figure 6:
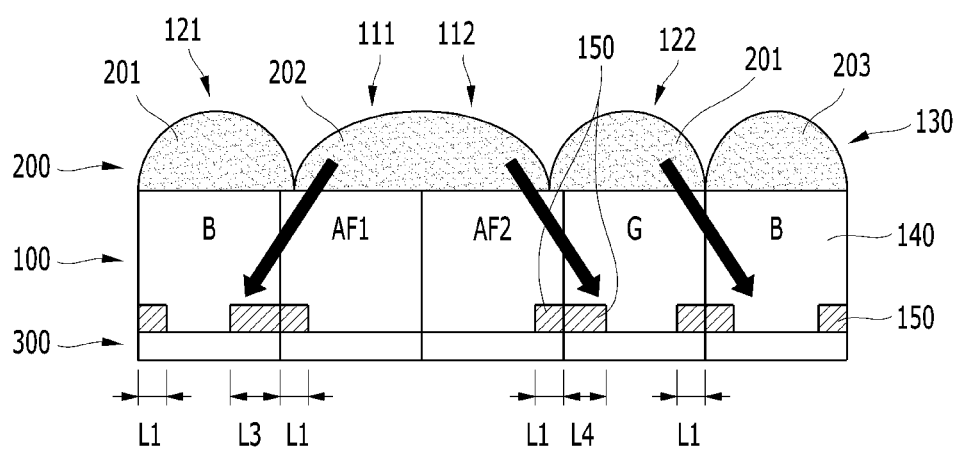

FIG. 5 is a view illustrating a unit pixel array according to an exemplary embodiment of the present disclosure. FIG. 6 is a view taken along line I-I' of FIG. 5 and illustrating a cross-sectional structure of the unit pixel array according to an exemplary embodiment of the present disclosure.

The exemplary embodiment in FIG. 5 is the same as the exemplary embodiment in FIG. 1 except that light shields 150 of adjacent sides of a left peripheral pixel 121 disposed at a left side of a first phase-difference detection pixel 111 and a right peripheral pixel 122 disposed at a right side of a second phase-difference detection pixel 112 have different widths.

The peripheral pixels 121 and 122 disposed at the right and left sides of the pair of phase-difference detection pixels 111 and 112 may include color filters 140 having different wavelengths. An amount of light received by the peripheral pixels 121 and 122 may be different according to the wavelength of the color filter included in the peripheral pixel. Referring to FIG. 5, the left peripheral pixel 121 adjacent to the left side of the first phase-difference detection pixel 111 includes a B filter. The right peripheral pixel 122 adjacent to the right side of the second phase-difference detection pixel 112 includes a G filter. The B filter has a relatively shorter wavelength and a greater amount of received light than the G filter. A width of a light shield 150 of the left peripheral pixel 121 including the B filter may be greater than that of the right peripheral pixel 122 having the G filter.

Referring to FIG. 6, a width L3 of the light shield 150 of the adjacent side of the left peripheral pixel 121 is greater than a width L4 of the light shield 150 of the adjacent side of the right peripheral pixel 122. Each of the widths L3 and L4 of the light shields 150 of the adjacent sides of the peripheral pixels 121 and 122 may be greater than a reference width L1.

Figure 7:
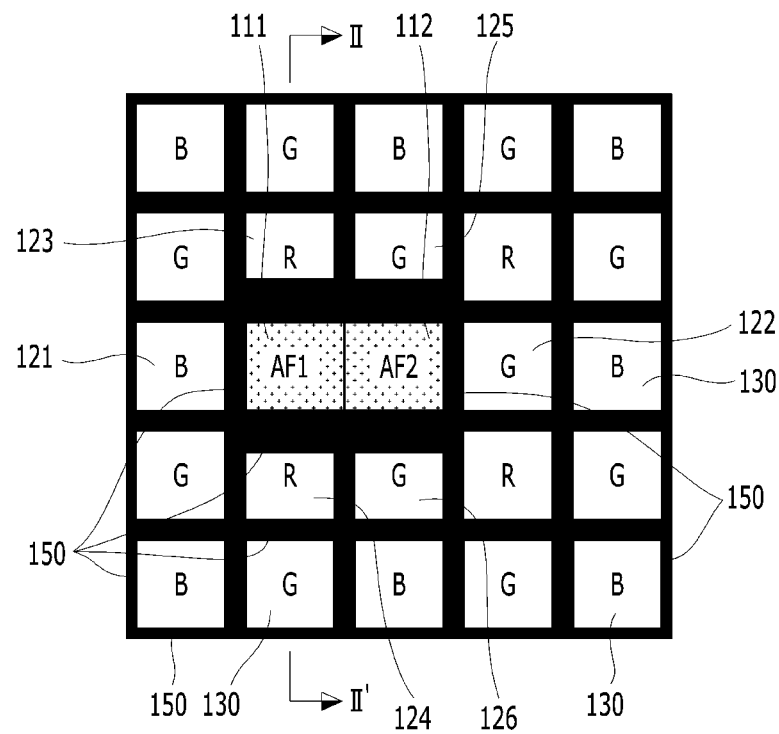
Figure 8:
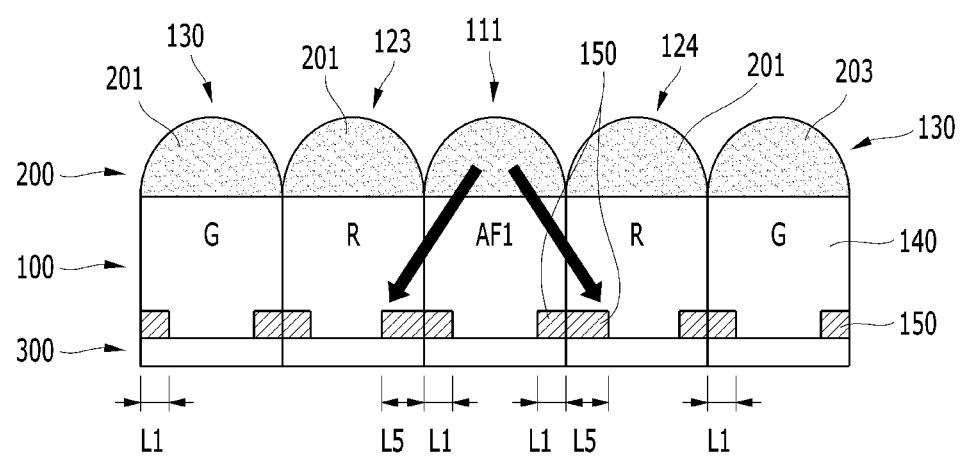

FIG. 7 is a view illustrating a unit pixel array according to an exemplary embodiment of the present disclosure. FIG. 8 is a view taken along line II-IF of FIG. 7 and illustrating a cross-sectional structure of the unit pixel array according to an exemplary embodiment of the present disclosure.

The exemplary embodiment of FIG. 7 is the same as the exemplary embodiment of FIG. 1 except that peripheral pixels are disposed above and below phase-difference detection pixels 111 and 112. A pixel at a second row and a second column above the first phase-difference detection pixel 111 refers to a first upper peripheral pixel 123. A pixel at a fourth row and the second column below the first phase-difference detection pixel 111 refers to a first lower peripheral pixel 124. A pixel at the second row and a third column above the second phase-difference detection pixel 112 refers to a second upper peripheral pixel 125. A pixel at the fourth row and the third column below the second phase-difference detection pixel 112 refers to a second lower peripheral pixel 126. The first upper peripheral pixel 123 and the second upper peripheral pixel 125 may be collectively referred to as the upper peripheral pixels. The first lower peripheral pixel 124 and the second lower peripheral pixel 126 may be collectively referred to as the lower peripheral pixels.

Referring to FIGS. 7 and 8, a width L5 of each of light shields 150 of adjacent sides, which is in contact with the phase-difference detection pixels 111 and 112, of the first upper peripheral pixel 123, the second upper peripheral pixel 125, the first lower peripheral pixel 124, and the second lower peripheral pixel 126, is substantially the same. The width L5 of the light shield 150 may be greater than a reference width L1.

Figure 9:
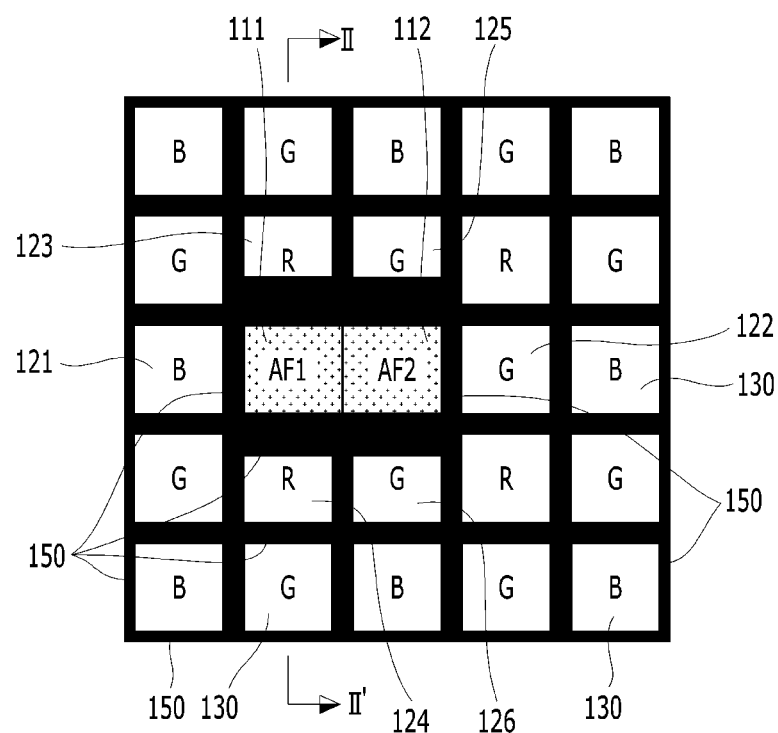
Figure 10:
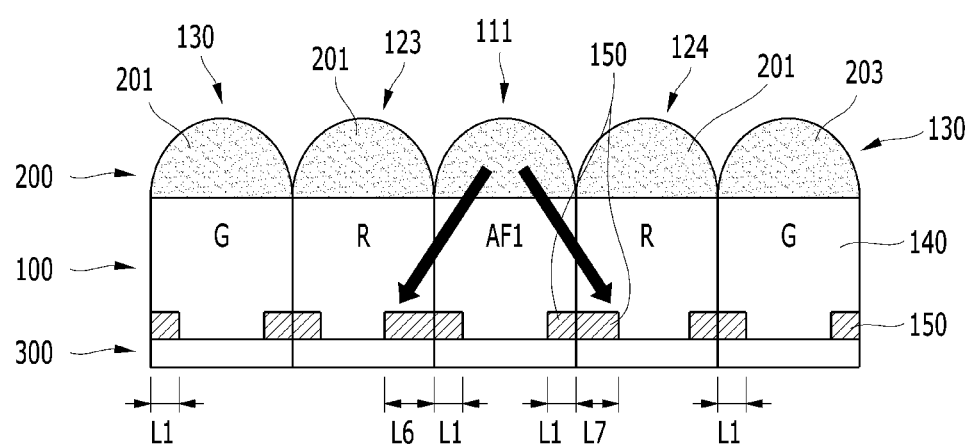

FIG. 9 is a view illustrating a unit pixel array according to an exemplary embodiment of the present disclosure. FIG. 10 is a view taken along line II-IF of FIG. 9 and illustrating a cross-sectional structure of the unit pixel array according to an exemplary embodiment of the present disclosure.

The exemplary embodiment of FIG. 9 is the same as the exemplary embodiment of FIG. 7 except that light shields of adjacent sides of upper peripheral pixels 123 and 125 and lower peripheral pixel 124 and 126 disposed above and below a pair of phase-difference detection pixels 111 and 112 have different widths.

Referring to FIGS. 9 and 10, a width L6 of each of light shields 150 of adjacent sides of the upper peripheral pixels 123 and 125 is smaller than a width L7 of each of light shields 150 of adjacent sides of the lower peripheral pixels 124 and 126. Each of the widths L6 and L7 of the light shields 150 of the adjacent sides of the peripheral pixels 123, 124, 125, and 126 may be greater than a reference width L1. The width of the light shield 150 of the adjacent side of the first upper peripheral pixel 123 may be different from that of the light shield 150 of the adjacent side of the second upper peripheral pixel 125. The width of the light shield 150 of the adjacent side of the first lower peripheral pixel 124 may also be different from that of the light shield 150 of the adjacent side of the second lower peripheral pixel 126. The widths of the light shields 150 of the adjacent sides of the peripheral pixels may be different for each of the peripheral pixels.

Figure 11:
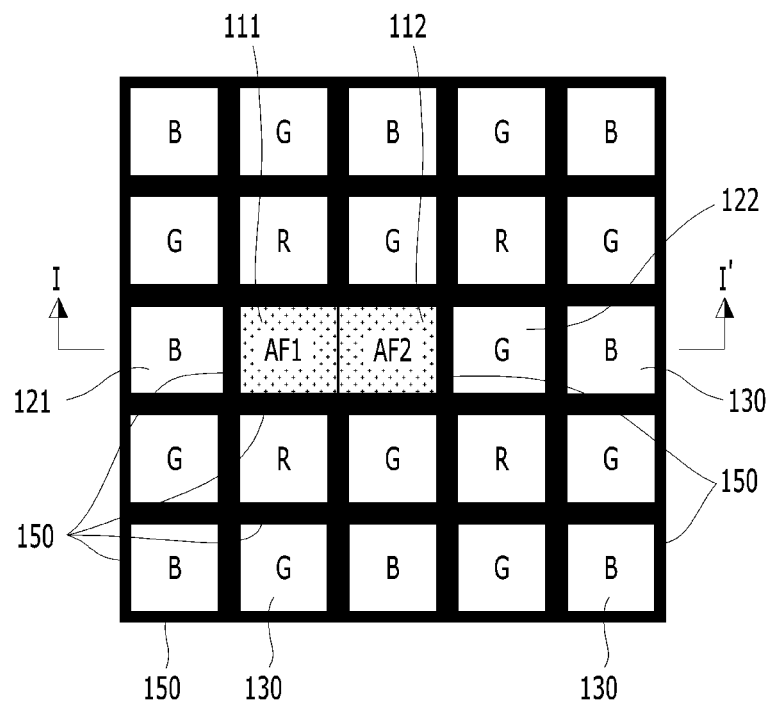
Figure 12:
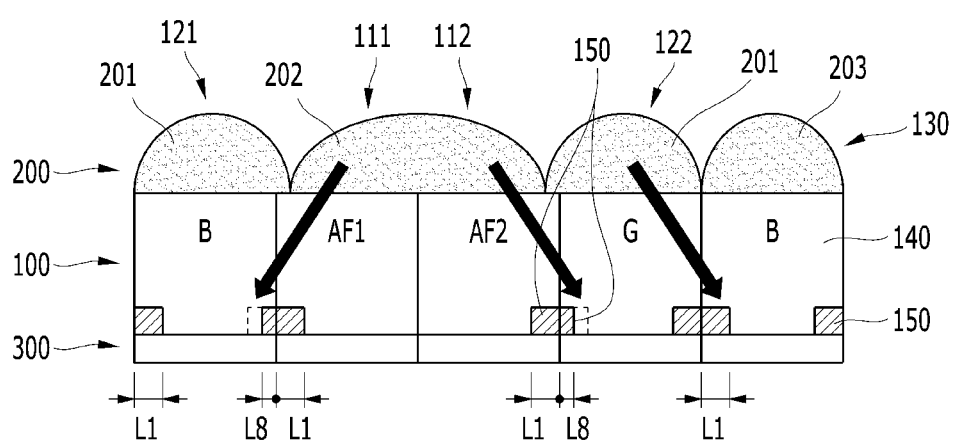

FIG. 11 is a view illustrating a unit pixel array according to an exemplary embodiment of the present disclosure. FIG. 12 is a view taken along line I-I' of FIG. 11 and illustrating a cross-sectional structure of the unit pixel array according to an exemplary embodiment of the present disclosure.

In some cases, a light-receiving rate of a peripheral pixel is decreased by a structure of phase-difference detection pixels 111 and 112 or a shape, a location, etc. of a microlens disposed on the phase-difference detection pixels 111 and 112. For example, when a size of the microlens decreases and a curvature thereof increases, a focusing function of an image sensor is improved. When the size of the microlens decreases, an amount of light being scattered and dispersed toward the peripheral pixel decreases, and thus, the light-receiving rate of the peripheral pixel decreases in some cases.

A width of a light shield 150 of an adjacent side, which is in contact with the phase-difference detection pixels 111 and 112, among four sides forming outer sides of the peripheral pixel may be smaller than a reference width L1, which is a width of a light shield 150 disposed at each of the other pixels or sides. When the width of the light shield 150 decreases, a light-receiving rate of the peripheral pixel may increase.

Referring to FIG. 11, the light-receiving rate of the peripheral pixel may be increased by decreasing the width of the light shield 150 of each of adjacent sides of a left peripheral pixel 121 and a right peripheral pixel 122. A general pixel 130, through which a wavelength identical to a wavelength passing through the left peripheral pixel 121 having a B filter passes, is disposed at a third row and a fifth column of the unit pixel array. The general pixel 130 having the B filter is not affected by the phase-difference detection pixels 111 and 112. A light-receiving rate of the left peripheral pixel 121 in which the width of the light shield is adjusted may be controlled to be the same as that of the general pixel 130 in which the width of the light shield is not adjusted. Since the light-receiving rate of the peripheral pixel is controlled to be the same as that of the general pixel 130, quality degradation of an image due to a signal difference may be prevented or reduced.

Referring to FIG. 12 which is a cross-sectional view taken along line I-I' of FIG. 11, a width L8 of the light shield 150 extending toward the peripheral pixel from the adjacent side, which is a boundary between the first phase-difference detection pixel 111 and the left peripheral pixel 121, may be smaller than the reference width L1, which is the width of each of the light shields 150 of the other pixels. In the right peripheral pixel 122 including a G filter and adjacent to a right side of the second phase-difference detection pixel 112, the width L8 of the light shield 150 of the adjacent side which is a boundary of the second phase-difference detection pixel 112 may also be smaller than the reference width L1.

In FIG. 12, when the width of the light shield 150 of the adjacent side of the left peripheral pixel 121 is the reference width L1 indicated by a dotted line, light scattered or dispersed by the first phase-difference detection pixel 111 may be blocked by the light shield 150. When the width L8 of the light shield 150 is smaller than the reference width L1, since subject light may further pass through the left peripheral pixel 121 due to a decreased width L1-L8, an amount of received light of the left peripheral pixel 121 may be increased. The width L8 of the light shield 150 may be set so that the general pixel 130 at the third row and the fifth column and which is not affected by the phase-difference detection pixel has the same signal size as the left peripheral pixel 121.

Figure 13:
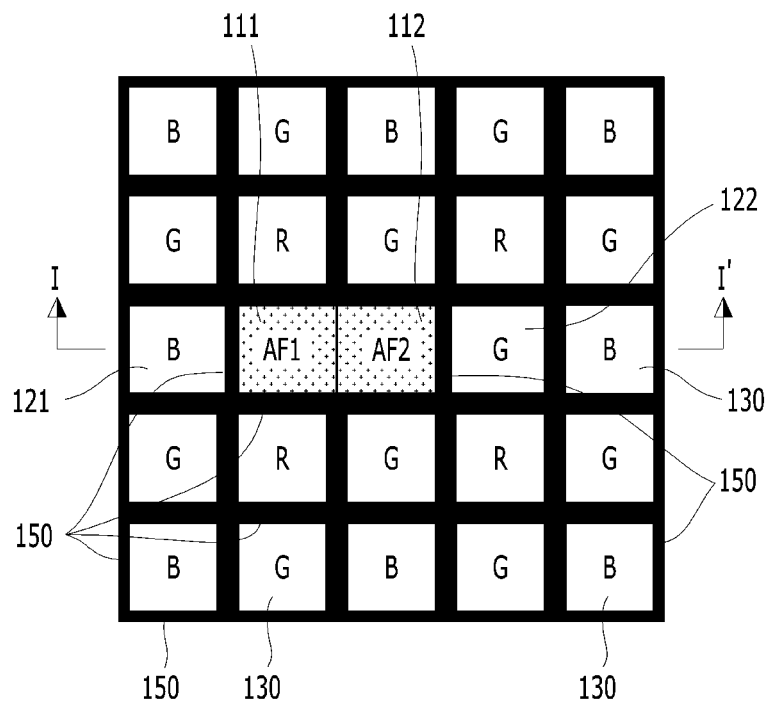
Figure 14:
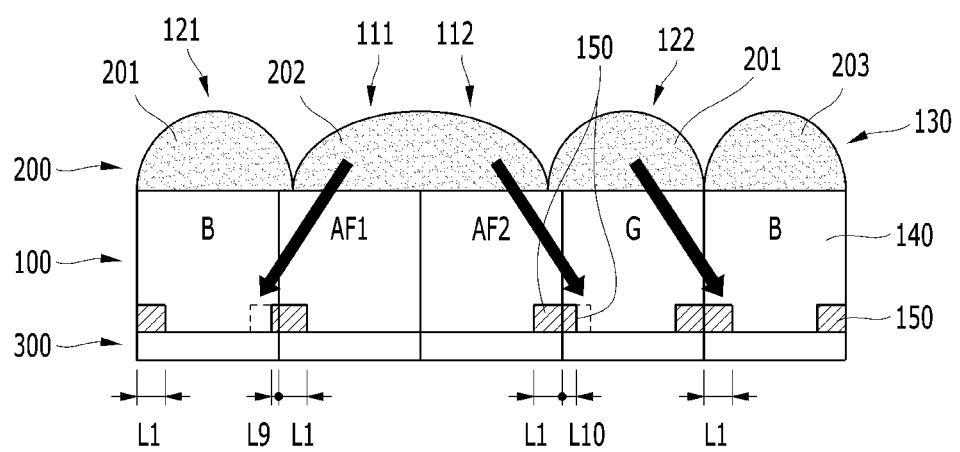

FIG. 13 is a view illustrating a unit pixel array according to an exemplary embodiment of the present disclosure. FIG. 14 is a view taken along line I-I' of FIG. 13 and illustrating a cross-sectional structure of the unit pixel array according to an exemplary embodiment of the present disclosure.

The exemplary embodiment of FIG. 13 is the same as the exemplary embodiment of FIG. 11 except that light shields 150 of adjacent sides of a left peripheral pixel 121 and a right peripheral pixel 122 disposed at right and left sides of a pair of phase-difference detection pixels 111 and 112 have different widths.

Referring to FIGS. 13 and 14, widths of the light shields 150 of the adjacent sides of the left peripheral pixel 121 and the right peripheral pixel 122 may be adjusted to compensate for a decrease in a light-receiving rate of the peripheral pixels 121 and 122 due to the phase-difference detection pixels 111 and 112. The light-receiving rates of the peripheral pixels 121 and 122 may be different for each of the peripheral pixels 121 and 122 according to a wavelength of a color filter 140 included in each of the peripheral pixels 121 and 122 and the phase-difference detection pixels 111 and 112, a shape of the phase-difference detection pixels 111 and 112, and a shape and size of the microlenses 201 and 202. For example, a light-receiving rate of the left peripheral pixel 121 may further decrease in comparison to a light-receiving rate of the right peripheral pixel 122. A width L9 of the light shield 150 of the adjacent side of the left peripheral pixel 121 may be smaller than a width L10 of the light shield 150 of the adjacent side of the right peripheral pixel 122. Each of the widths L9 and L10 of the light shields 150 may be smaller than a reference width L1.

Figure 15:
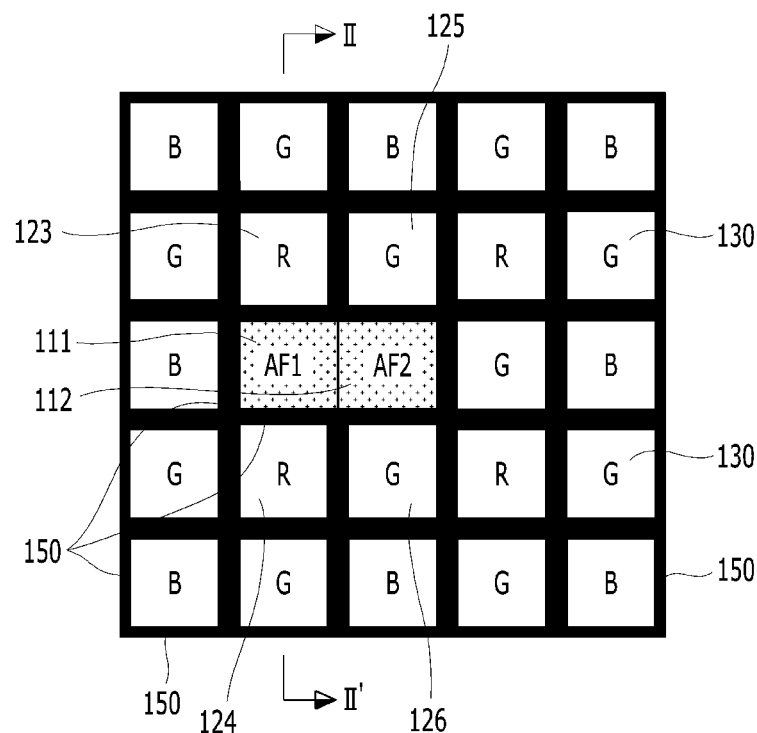
Figure 16:
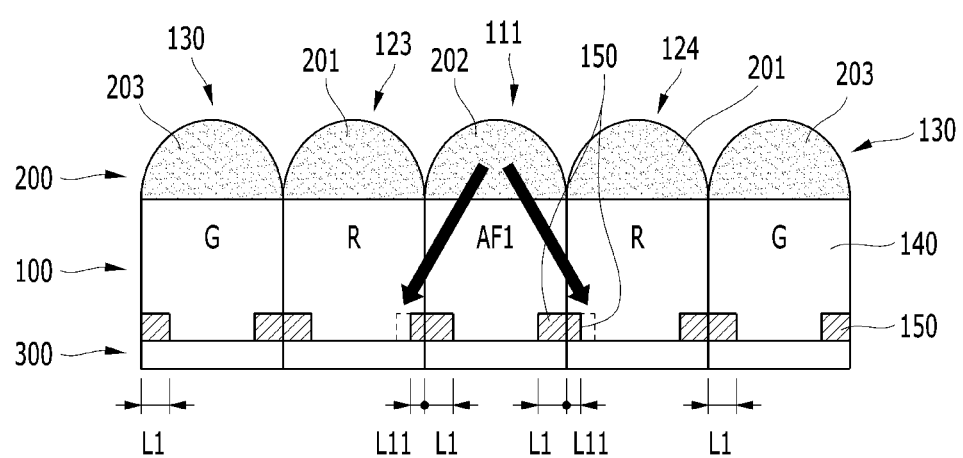

FIG. 15 is a view illustrating a unit pixel array according to an exemplary embodiment of the present disclosure. FIG. 16 is a view taken along line II-IF of FIG. 15 and illustrating a cross-sectional structure of the unit pixel array according to an exemplary embodiment of the present disclosure.

The exemplary embodiment of FIG. 15 is the same as the exemplary embodiment of FIG. 11 except that peripheral pixels 123, 124, 125 and 126 are disposed above and below phase-difference detection pixels 111 and 112. Widths of light shields 150 of adjacent sides of a first upper peripheral pixel 123, a second upper peripheral pixel 125, a first lower peripheral pixel 124, and a second lower peripheral pixel 126 may be smaller than a reference width L1.

Referring to FIG. 16, which is a cross-sectional view taken along line II-IF of FIG. 15, widths L11 of the light shields 150 of the adjacent sides of the first upper peripheral pixel 123 and the first lower peripheral pixel 124 may be substantially the same. The width L11 of the light shield 150 may be smaller than the reference width L1. Light scattered by the first phase-difference detection pixel 111 and incident on the first upper peripheral pixel 123 and the first lower peripheral pixel 124 is indicated as an arrow. When the width of the light shield 150 of the adjacent side of the peripheral pixel is the reference width L1, scattered light may be blocked by the light shields 150 having the reference width L1 indicated by dotted lines. An amount of scattered light incident on the first upper peripheral pixel 123 and the first lower peripheral pixel 124 may be increased due to the width L11 of each of the light shields 150 of the adjacent sides of the first upper peripheral pixel 123 and the first lower peripheral pixel 124 being smaller than the reference width L1. A total amount of received light of the first upper peripheral pixel 123 and the first lower peripheral pixel 124 may increase. The width L11 of each of the light shields 150 of the adjacent sides of the second upper peripheral pixel 125 and the second lower peripheral pixel 126 may also be smaller than the reference width L1.

Figure 17:
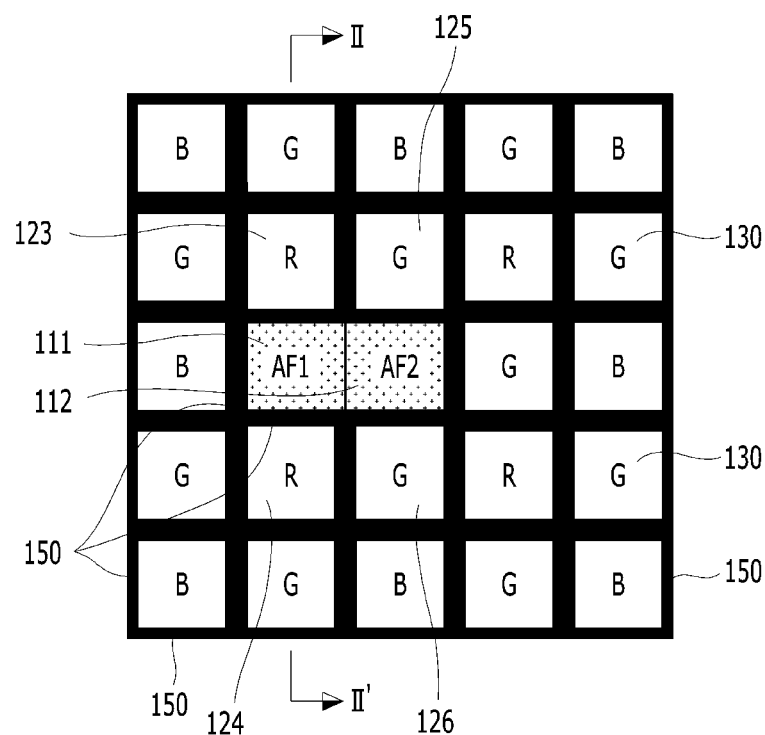
Figure 18:
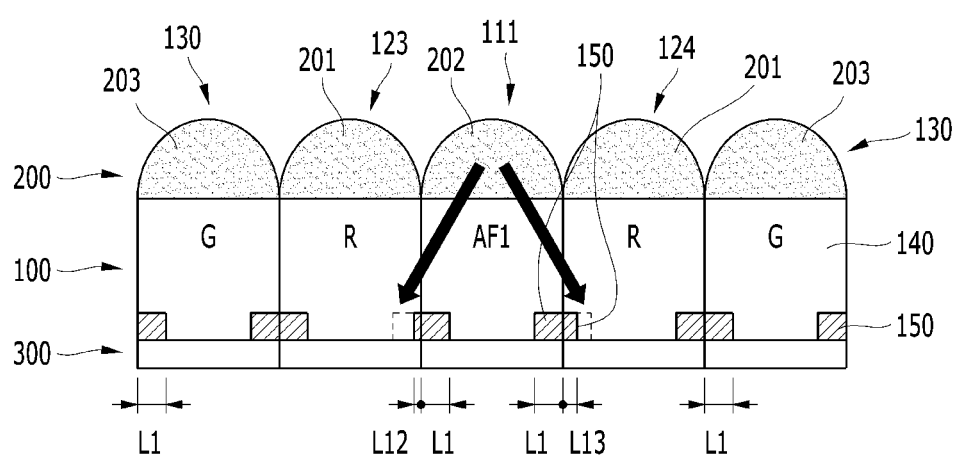

FIG. 17 is a view illustrating a unit pixel array according to an exemplary embodiment of the present disclosure. FIG. 18 is a view taken along line II-IF of FIG. 17 and illustrating a cross-sectional structure of the unit pixel array according to an exemplary embodiment of the present disclosure.

The exemplary embodiment of FIG. 17 is the same as the exemplary embodiment of FIG. 15 except that light shields 150 of adjacent sides of upper peripheral pixels 123 and 125, and lower peripheral pixels 124 and 126, have different widths.

Referring to FIGS. 17 and 18, a width L12 of the light shield 150 of the adjacent side of the upper peripheral pixel 123 is smaller than a width L13 of the light shield 150 of the adjacent side of the lower peripheral pixel 124. Each of the widths L12 and L13 of the light shields 150 of the adjacent sides of the peripheral pixels 123 and 124 may be smaller than a reference width L1. Since a difference exists in a change in an amount of received light of each of the peripheral pixels 123 and 124, adjusted widths of the light shields 150 of the adjacent sides may also be different for each of the peripheral pixels 123 and 124.

Figure 19:
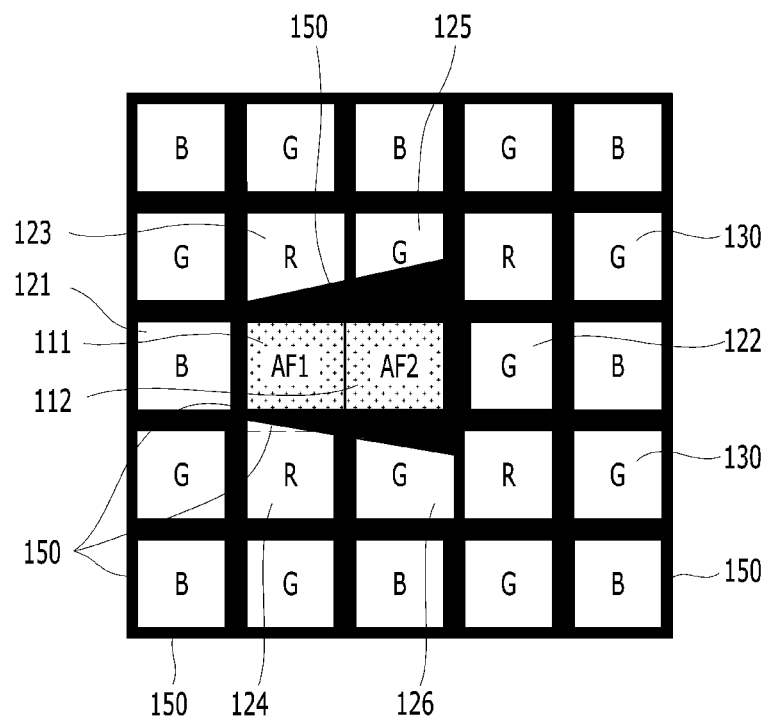

FIG. 19 is a view illustrating a unit pixel array according to an exemplary embodiment of the present disclosure.

Six pixels disposed at right, left, upper, and lower sides of phase-difference detection pixels 111 and 112 may be peripheral pixels. The peripheral pixels may also be pixels disposed in a diagonal direction from the phase-difference detection pixels 111 and 112 in addition to the pixels disposed to have adjacent sides at the right, left, upper, and lower sides of the phase-difference detection pixels 111 and 112. A plurality of pixels of which an amount of received light is changed by the phase-difference detection pixels 111 and 112, and which are consecutively adjacent to the phase-difference detection pixels 111 and 112 in a specific direction, may also refer to the peripheral pixels.

The peripheral pixels disposed at the left, upper, and lower sides of the first phase-difference detection pixel 111 refer to a left peripheral pixel 121, a first upper peripheral pixel 123, and a first lower peripheral pixel 124. The peripheral pixels disposed at the right, upper, and lower sides of the second phase-difference detection pixel 112 refer to a right peripheral pixel 122, a second upper peripheral pixel 125, and a second lower peripheral pixel 126.

Referring to FIG. 19, widths of light shields of the adjacent sides of the peripheral pixels may be different from each other along the adjacent sides. For example, in the light shield 150 of the adjacent side of the first upper peripheral pixel 123 shown in FIG. 19, a width of the adjacent side may continuously increase in one direction. The light shield 150 of the adjacent side of the first lower peripheral pixel 124 may be continuously changed such that the width thereof at one side of the adjacent side is smaller than a reference width, and the width thereof at the other side of the adjacent side is greater than the reference width.

A change in a light-receiving rate of each of the peripheral pixels adjacent to the pair of adjacent phase-difference detection pixels 111 and 112 in a length direction may be greater than a change in a light-receiving rate of each of the other peripheral pixels. For example, when the pair of phase-difference detection pixels 111 and 112 are laterally disposed adjacent to each other, the change in the light-receiving rate of each of the left peripheral pixel 121 and the right peripheral pixel 122 may be greater than the change in the light-receiving rate of each of the upper peripheral pixels 123 and 125 and the lower peripheral pixels 124 and 126.

When the pair of phase-difference detection pixels 111 and 112 are vertically disposed to be adjacent to each other, a change in the width of the light shield 150 of each of the adjacent sides of the upper peripheral pixels 123 and 125 and the lower peripheral pixels 124 and 126 may be greater than a change in the width of the light shield 150 of each of the adjacent sides of the left peripheral pixel 121 and the right peripheral pixel 122. The change in the width of the light shield 150 refers to the width relatively increasing or decreasing in comparison to a reference width L1.

Figure 20:
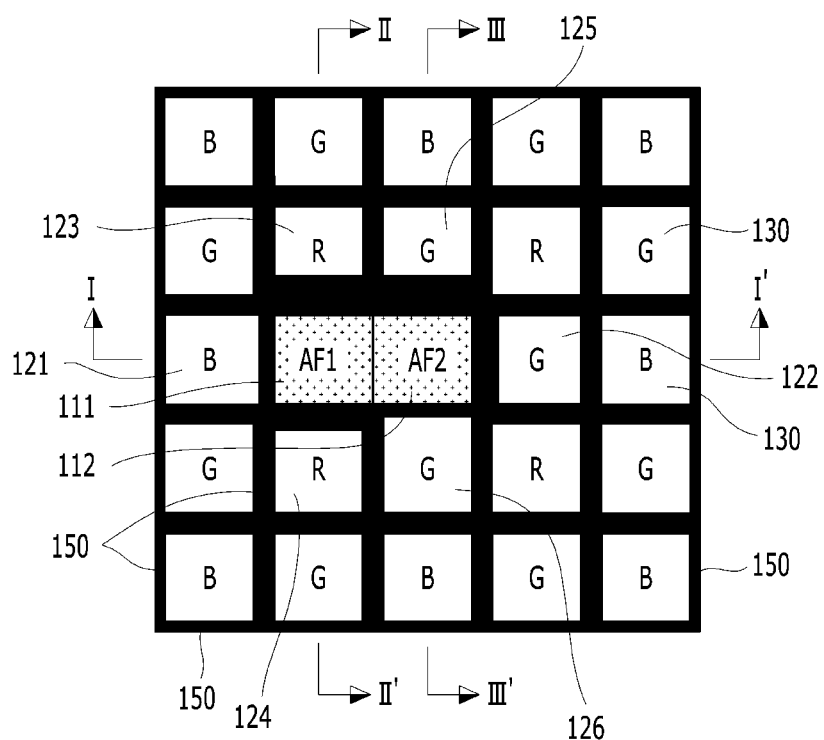
Figure 21:
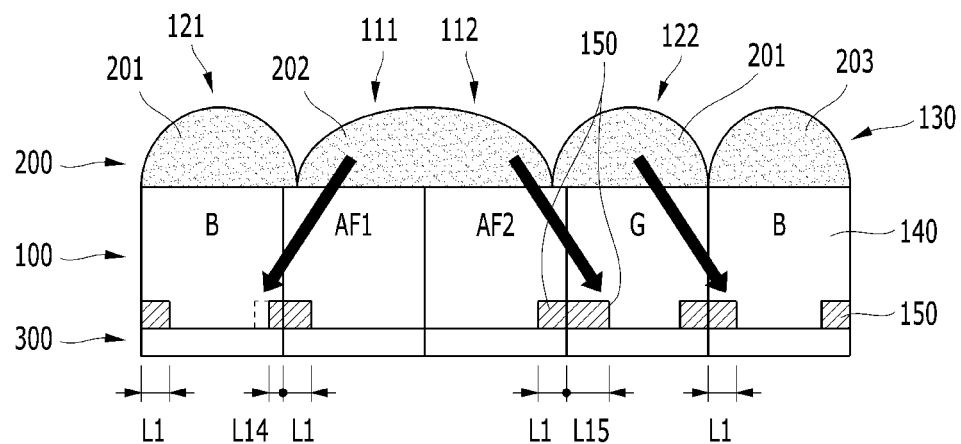
Figure 22:
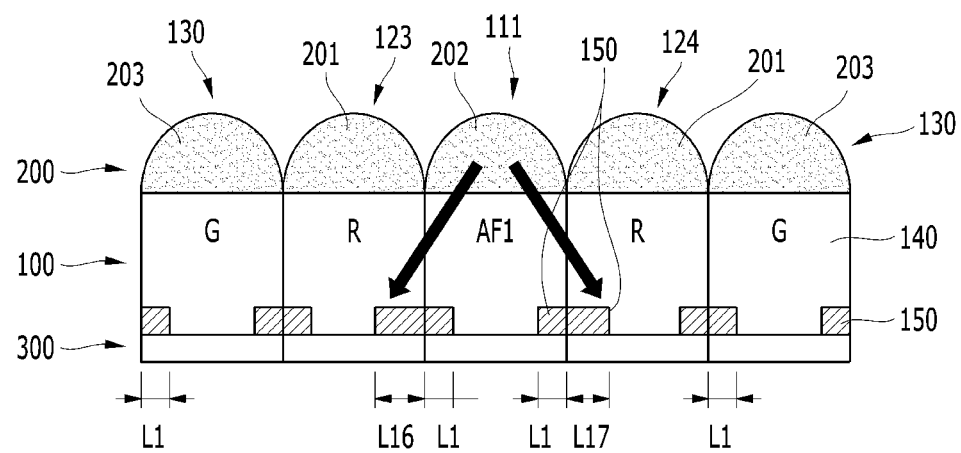
Figure 23:
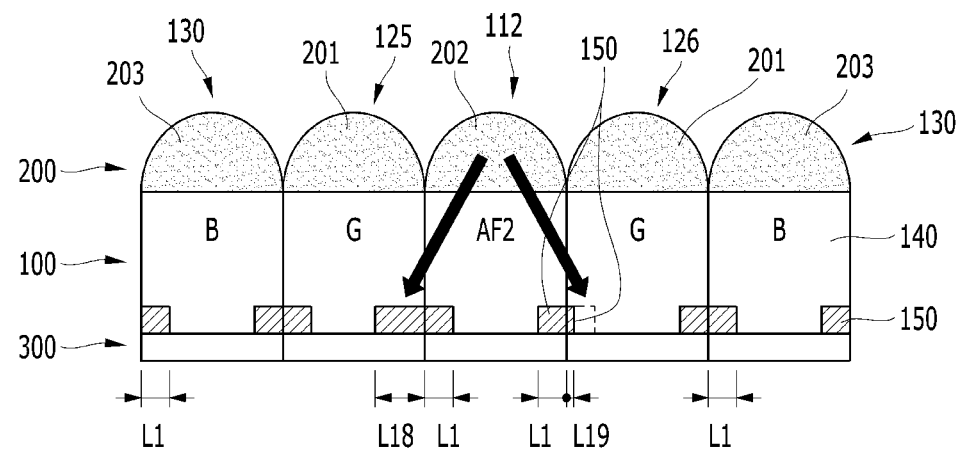

FIG. 20 is a view illustrating a unit pixel array according to an exemplary embodiment of the present disclosure. FIG. 21 is a view taken along line I-I' of FIG. 20 and illustrating a cross-sectional structure of the unit pixel array according to an exemplary embodiment of the present disclosure. FIG. 22 is a view taken along line II-IF of FIG. 20 and illustrating a cross-sectional structure of the unit pixel array according to an exemplary embodiment of the present disclosure. FIG. 23 is a view taken along line III-III' of FIG. 20 and illustrating a cross-sectional structure of the unit pixel array according to an exemplary embodiment of the present disclosure.

Referring to FIG. 20, a width of each of light shields 150 of adjacent sides of each of six peripheral pixels may be greater or smaller than a width of each of light shields 150 of other adjacent sides or peripheral pixels thereof. The width of the light shield 150 of the adjacent side may be different from the width of each of the light shields 150 of the other adjacent sides.

Referring to FIG. 21, which is a cross-sectional view taken along line I-I' of FIG. 20, a width L14 of a light shield 150 of an adjacent side of a left peripheral pixel 121 having a B filter is smaller than a reference width L1, and a width L15 of a light shield 150 of an adjacent side of a right peripheral pixel 122 having a G filter is greater than the reference width L1. The widths of light shields 150 may be adjusted so that an amount of received light of the left peripheral pixel 121 increases and an amount of received light of the right peripheral pixel 122 decreases. By adjusting the width of the light shield 150 of the adjacent side, the amount of received light of the left peripheral pixel 121 may be compensated for to be the same as an amount of received light of a general pixel 130 at a third row and a fifth column of the unit pixel, which is shown in FIG. 20, and is not affected by the phase-difference detection pixels 111 and 112.

Referring to FIG. 22, which is a cross-sectional view taken along line II-IF of FIG. 20, a width of a light shield 150 of an adjacent side of each of a first upper peripheral pixel 123 and a first lower peripheral pixel 124, which have R filters, is greater than the reference width L1. Even when the peripheral pixels 123 and 124 include the same R filter, widths L16 and L17 of the light shields of the adjacent sides of the first upper peripheral pixel 123 and the first lower peripheral pixel 124 may be set to be different according to other conditions such as, for example, shapes or sizes of microlenses.

Referring to FIG. 23, which is a cross-sectional view taken along line III-III' of FIG. 20, widths L18 and L19 of light shields 150 of adjacent sides of a second upper peripheral pixel 125 and a second lower peripheral pixel 126, which include the same G filter, may be different. The width L18 of the light shield 150 may be greater than the reference width L1, and the width L19 may be smaller than the reference width L1.

FIGS. 24 to 33 are views each illustrating a unit pixel array according to an exemplary embodiment of the present disclosure.

Figure 24:
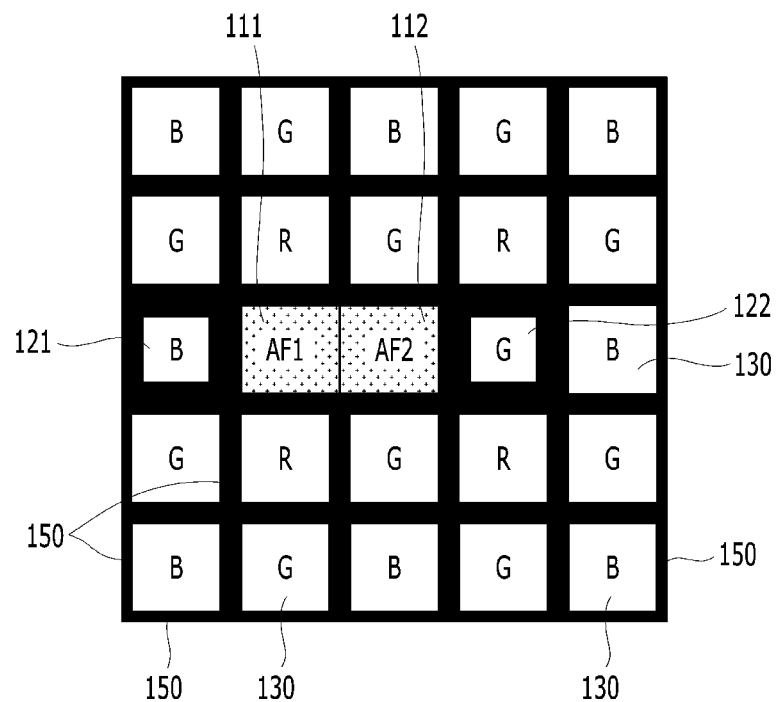

Referring to FIG. 24, like the exemplary embodiment of FIG. 1, pixels disposed at right and left sides of phase-difference detection pixels 111 and 112 may be peripheral pixels 121 and 122. Widths of light shields 150 of all four sides of the phase-difference detection pixels 111 and 112, which include adjacent sides of the peripheral pixel, may be adjusted. FIG. 24 shows a case in which widths of light shields 150 of the left peripheral pixel 121 and the right peripheral pixel 122 are the same, and are greater than a reference width. The widths of the light shields 150 of all of the four sides including the adjacent sides of the peripheral pixels may also be adjusted to be the same. When the widths of the light shields 150 of all of the four sides are adjusted, the widths of the light shields 150 extending toward an opening range corresponding to a center portion of the pixel may be decreased. A dispersion characteristic of a light-receiving rate may be improved more than that of a case in which only the width of the light shield 150 of the adjacent side is adjusted.

Figure 25:
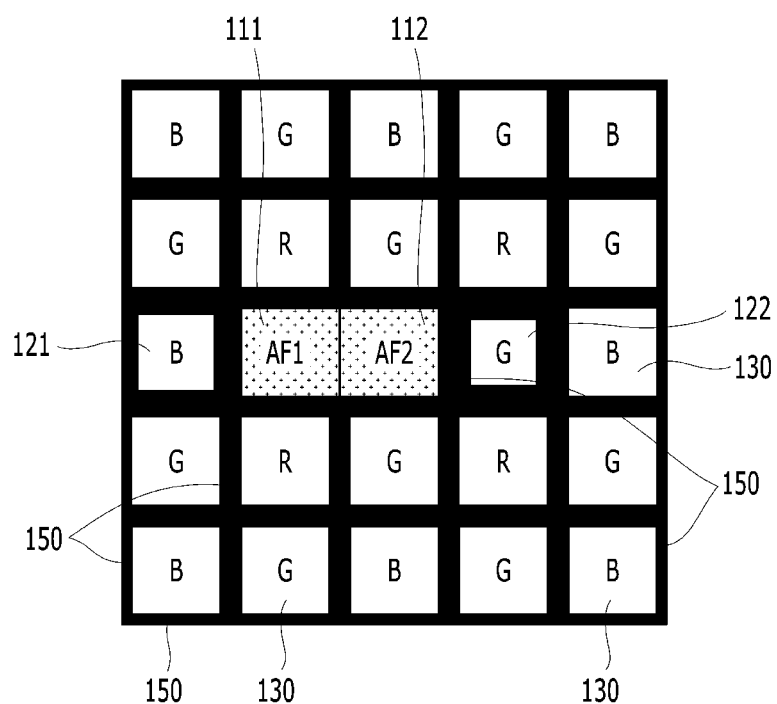

Referring to FIG. 25, widths of light shields 150 at four sides of a left peripheral pixel 121 and a right peripheral pixel 122, which are the same as those shown in the exemplary embodiment of FIG. 24, may be different. For example, in FIG. 25, the widths of the light shields 150 at the four sides of the left peripheral pixel 121 having a B filter may be smaller than widths of the light shields 150 at the four sides of the right peripheral pixel 122 having a G filter.

Figure 26:
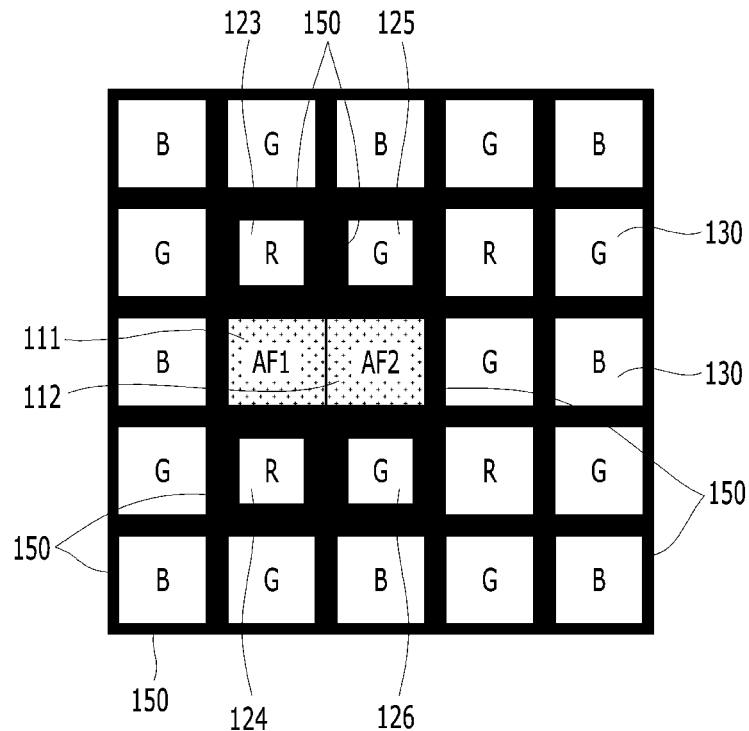
Figure 27:
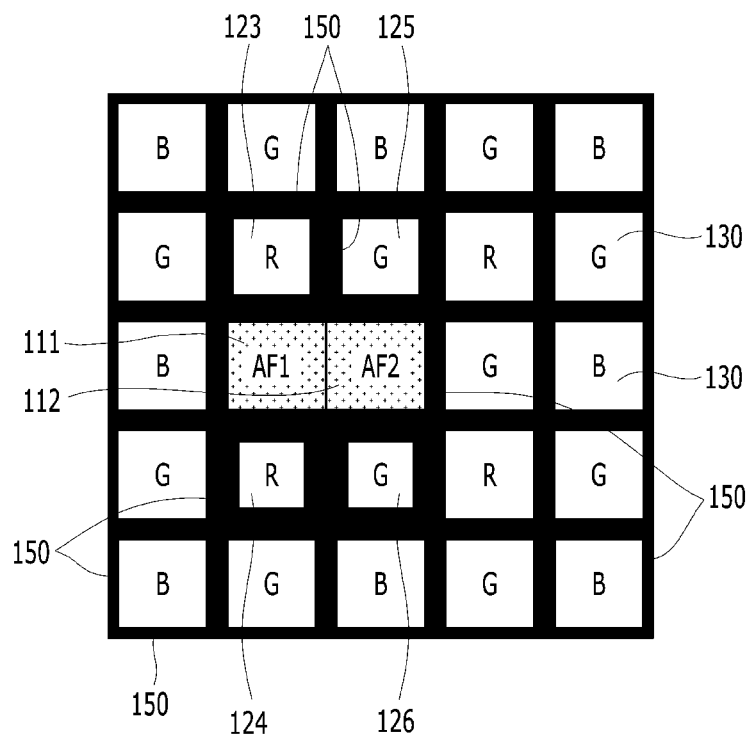
Figure 28:
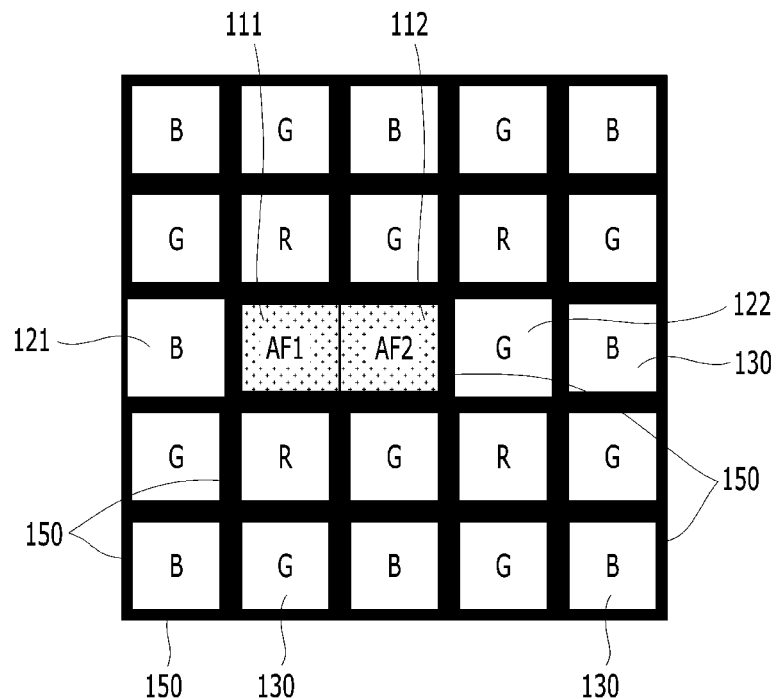
Figure 29:
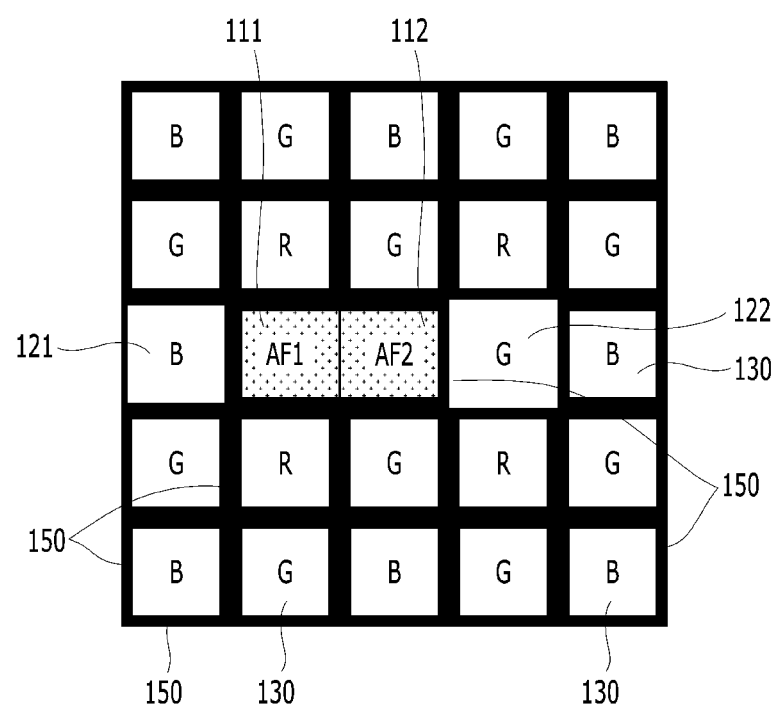
Figure 30:
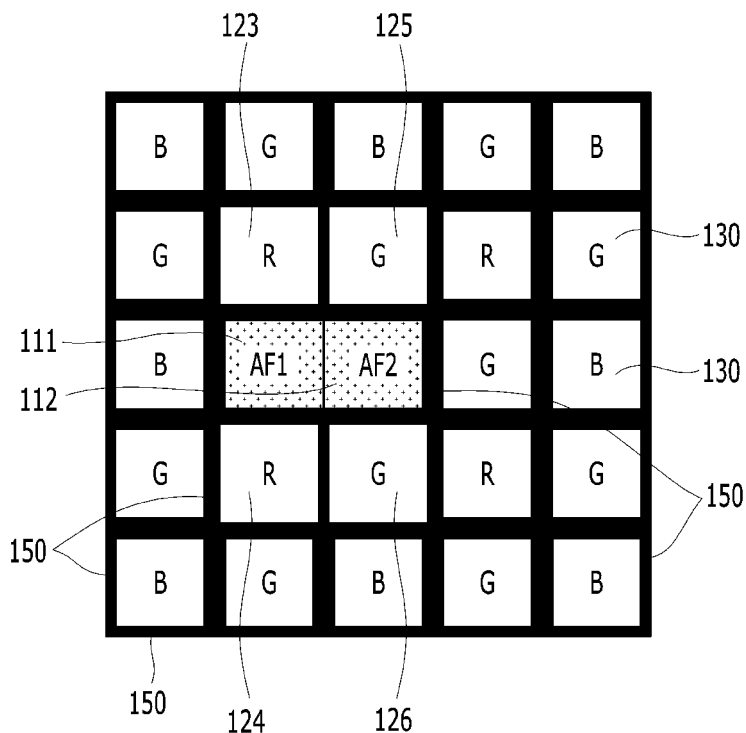
Figure 31:
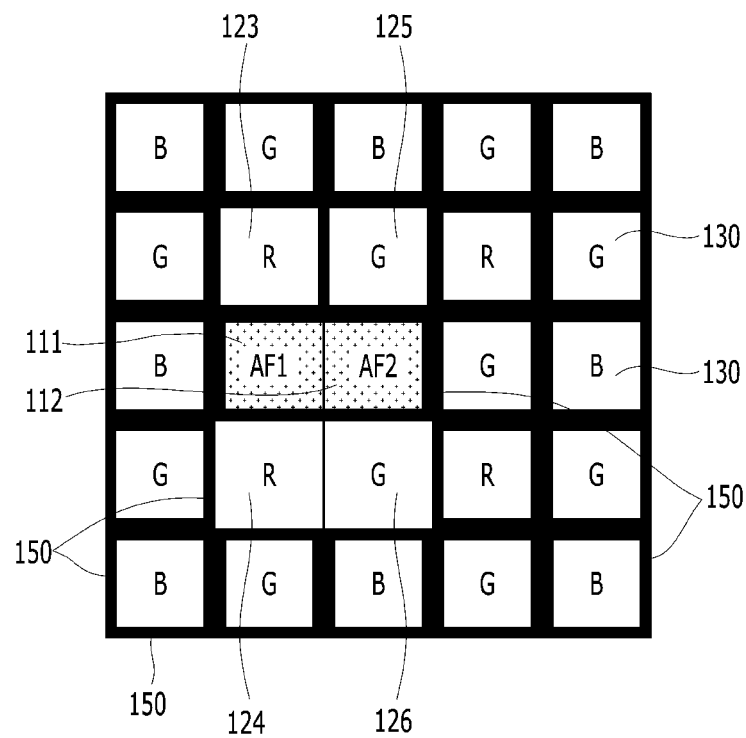

In FIGS. 26 and 27, widths of light shields 150 at four sides of each of a first upper peripheral pixel 123, a first lower peripheral pixel 124, a second upper peripheral pixel 125, and a second lower peripheral pixel 126 are adjusted. In FIG. 26, all of the widths of the light shields 150 of the four peripheral pixels may be the same. In FIG. 27, the width of each of the light shields 150 at the four sides of each of the first upper peripheral pixel 123 and the second upper peripheral pixel 125 may be different from the width of each of the light shields 150 at the four sides of each of the first lower peripheral pixel 124 and the second lower peripheral pixel 126. However, exemplary embodiments of the present disclosure are not limited thereto. For example, in exemplary embodiments, all of the widths of the light shields 150 at the four sides of each of the four peripheral pixels, which are the upper peripheral pixels 123 and 125 and the lower peripheral pixel 124 and 126, may be different.

The exemplary embodiments of FIGS. 28 to 31 correspond to the exemplary embodiments of FIGS. 24 to 27, and widths of light shields 150 at four sides of a peripheral pixel are smaller than a reference width.

Figure 32:
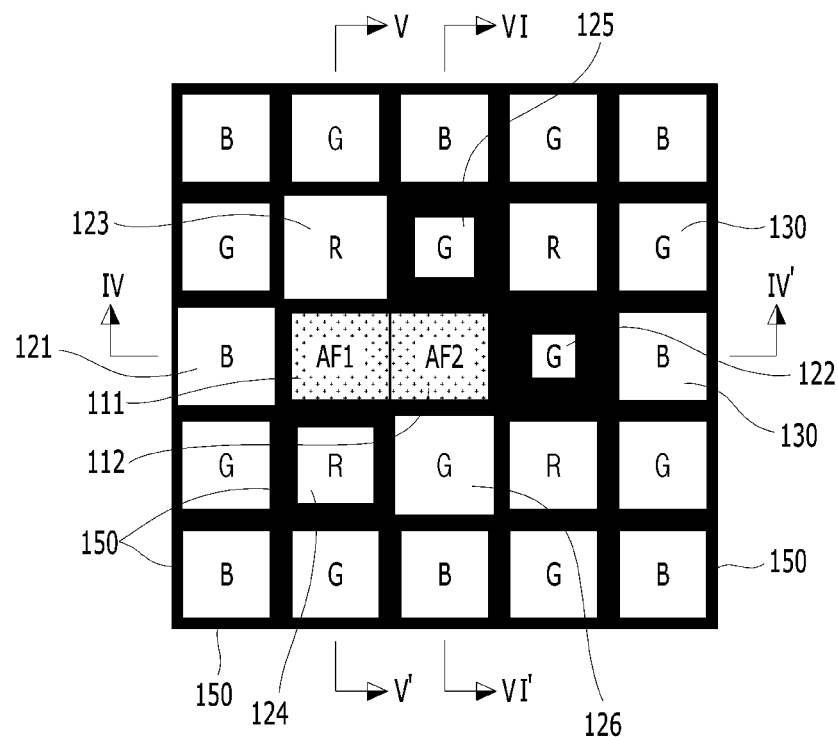
Figure 33:
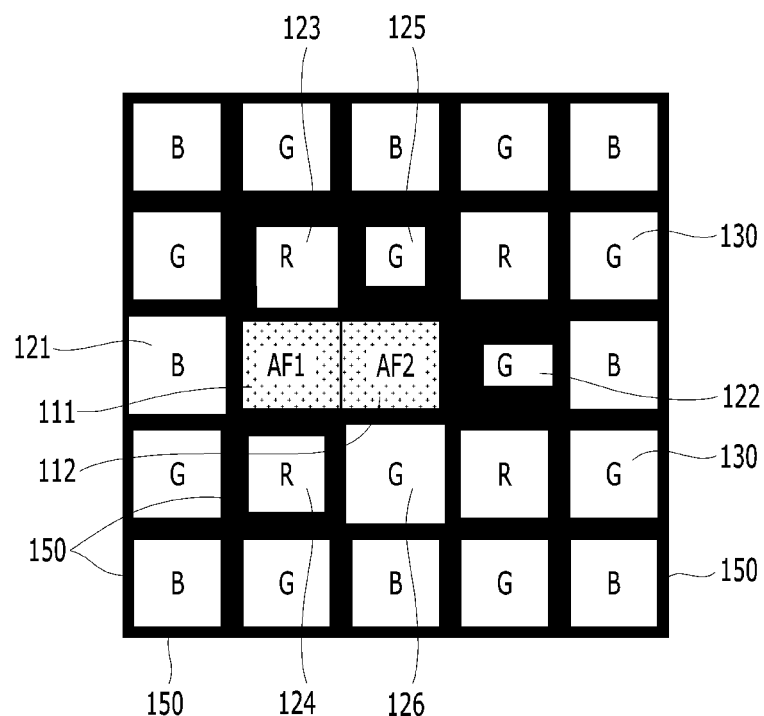

FIGS. 32 and 33 are views each illustrating a unit pixel array according to an exemplary embodiment of the present disclosure.

Six pixels disposed at right, left, upper, and lower sides of phase-difference detection pixels 111 and 112 may be peripheral pixels. In the peripheral pixels shown in FIGS. 32 and 33, the peripheral pixels disposed at the left, upper, and lower sides of a first phase-difference detection pixel 111 refer to a left peripheral pixel 121, a first upper peripheral pixel 123, and a first lower peripheral pixel 124. The peripheral pixels disposed at the right, upper, and lower sides of a second phase-difference detection pixel 112 refer to a right peripheral pixel 122, a second upper peripheral pixel 125, and a second lower peripheral pixel 126.

Referring to FIG. 32, light shields 150 at four sides of each of the six peripheral pixels may be wider or narrower than light shields 150 of the other pixels. Widths of the light shields 150 at the four sides of the peripheral pixels may be different for each of the peripheral pixels.

Referring to FIG. 33, widths of light shields 150 at four sides of one peripheral pixel may be different. For example, widths of light shields at left and upper sides of a first upper peripheral pixel 123 in FIG. 33 may be greater than a reference width. Widths of light shields 150 at right and lower sides of the first upper peripheral pixel 123 may be smaller than the reference width.

Figure 34:
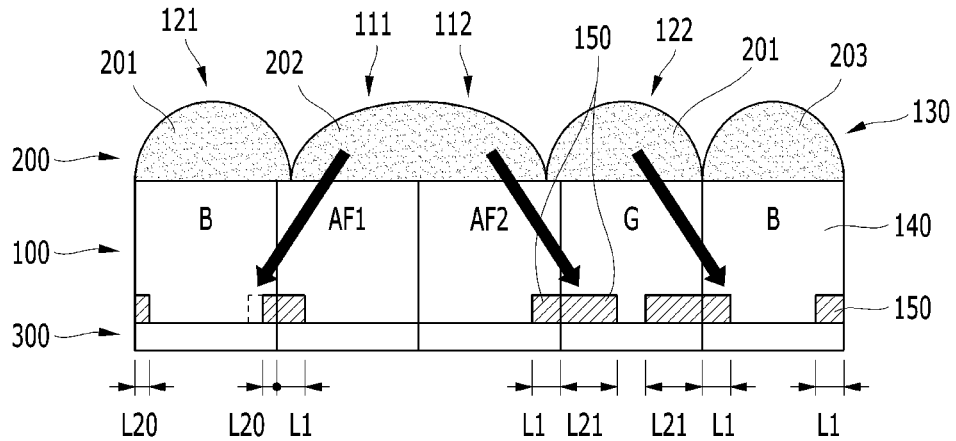
Figure 35:
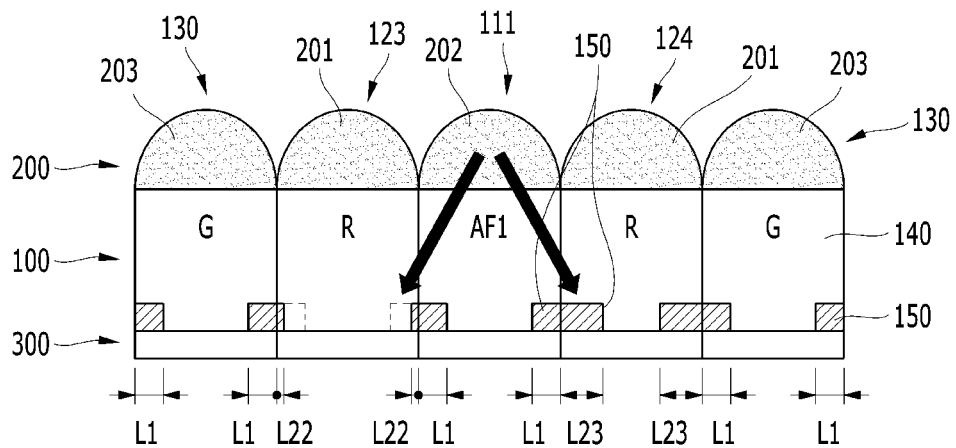
Figure 36:
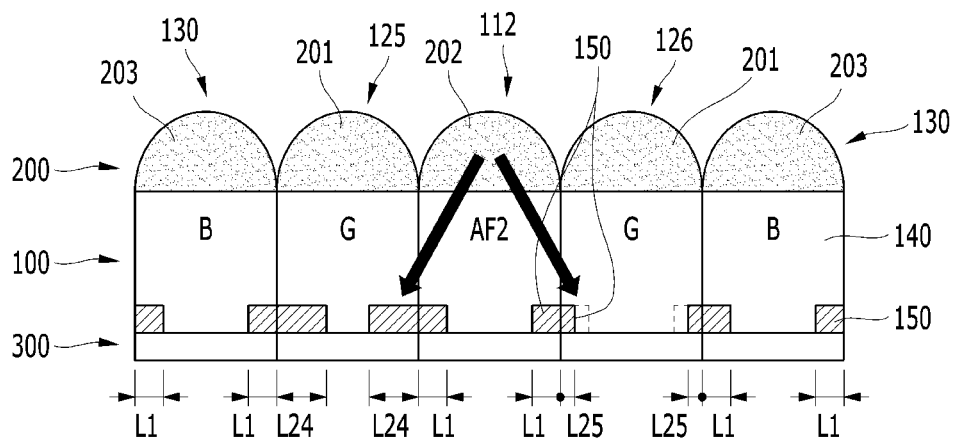

FIGS. 34 to 36 are views taken along lines IV-IV', V-V', and VI-VI' of FIG. 32, each illustrating a cross-sectional structure of the unit pixel array according to an exemplary embodiment of the present disclosure.

Referring to FIG. 34, a width L20 of a light shield 150 of each of four sides of a left peripheral pixel 121 having a B filter is smaller than a reference width L1, and a width L21 of a light shield 150 of each of four sides of a right peripheral pixel 122 having a G filter is greater than the reference width L1. An amount of received light of the left peripheral pixel 121 may increase, and an amount of received light of the right peripheral pixel 122 may decrease. By setting the widths of the light shields 150 at the four sides of the peripheral pixels to be different from the reference width L1, the amount of received light of the left peripheral pixel 121 may be compensated for to be the same as an amount of received light of a general pixel 130 at a third row and a fifth column of the unit pixel array of FIG. 32, which is not affected by phase-difference detection pixels 111 and 112.

Referring to FIG. 35, a width L22 of a light shield 150 of each of four sides of a first upper peripheral pixel 123 having an R filter is smaller than a reference width L1. A width L23 of a light shield 150 of each of four sides of a first lower peripheral pixel 124 having the same R filter as the first upper peripheral pixel 123 is greater than the reference width L1. Even when the peripheral pixels have the same R filter, the widths L22 and L23 of the light shields 150 at the four sides of each of the first upper peripheral pixel 123 and the first lower peripheral pixel 124 may be set to be different according to other conditions such as, for example, shapes or sizes of microlenses.

Referring to FIG. 36, widths L24 and L25 of light shields 150 of a second upper peripheral pixel 125 and a second lower peripheral pixel 126, which include the same G filter, may also be set to be different. The width L24 of the light shield 150 may be set to be greater than a reference width L1, and the width L25 may be set to be smaller than the reference width L1.

Figure 37:
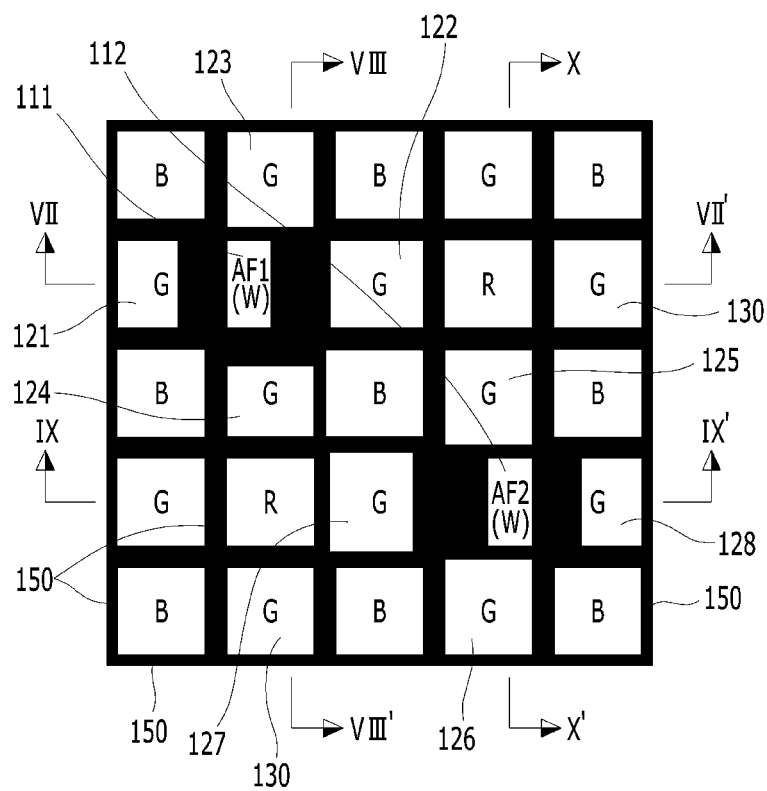

FIG. 37 is a view illustrating a unit pixel array according to an exemplary embodiment of the present disclosure.

A first phase-difference detection pixel 111 and a second phase-difference detection pixel 112 disposed adjacent to each other may be disposed to be spaced apart from each other so that there is no side shared therebetween. For example, unlike previously described exemplary embodiments, in the exemplary embodiment of FIG. 37, the first and second phase-difference detection pixels 111 and 112 are not directly adjacent to each other, and intervening elements are disposed therebetween. Light shields 150 of the pair of first phase-difference detection pixel 111 and second phase-difference detection pixel 112 may extend to be symmetrical to each other. The first and second phase-difference detection pixels 111 and 112 may receive light at locations which are symmetrical to each other, may be used to analyze a phase difference between the first and second phase-difference detection pixels 111 and 112, and may be used to perform an autofocus function.

Referring to FIG. 37, the first phase-difference detection pixel 111 may be disposed at a second row and a second column of the unit array pixel, and the second phase-difference detection pixel 112 may be disposed at a fourth row and a fourth column thereof. The light shield 150 may extend to be formed at a right side portion of the first phase-difference detection pixel 111, which is located in a direction toward the second phase-difference detection pixel 112. The light shield 150 may extend to a left side portion of the second phase-difference detection pixel 112 to be symmetrical to the light shield 150 of the first phase-difference detection pixel 111. Portions on which the light shields 150 are not disposed in the first and second phase-difference detection pixels 111 and 112 refer to openings. By analyzing phases of light received through the openings of the first and second phase-difference detection pixels 111 and 112, a phase difference in a lateral direction may be detected. The light shields 150 of the first and second phase-difference detection pixels 111 and 112 may extend downward and upward to be symmetrical to each other. By analyzing the phases of light received through the openings of the pair of phase-difference detection pixels 111 and 112, a phase difference in a vertical direction may be detected.

In an exemplary embodiment, The first phase-difference detection pixel 111 and the second phase-difference detection pixel 112 include color filters 140. The color filter 140 may be selected from among R, G, and B. The first and second phase-difference detection pixels 111 and 112 may have the same color filter 140. For example, a G filter having a relatively high light-receiving rate may be used in each of the first and second phase-difference detection pixels 111 and 112 so that a light-receiving rate thereof is not limited even when a size of the opening is decreased due to the light shield 150. In an exemplary embodiment, the first phase-difference detection pixel 111 and the second phase-difference detection pixel 112 do not include the color filter 140 and include a W filter or transparent filter.

Pixels disposed at right, left, upper, and lower sides of each of the first phase-difference detection pixel 111 and the second phase-difference detection pixel 112 may refer to peripheral pixels. As shown in FIG. 37, the peripheral pixels of the first phase-difference detection pixel 111 are a left peripheral pixel 121, a right peripheral pixel 122, an upper peripheral pixel 123, and a lower peripheral pixel 124. The peripheral pixels of the second phase-difference detection pixel 112 are a left peripheral pixel 127, a right peripheral pixel 128, an upper peripheral pixel 125, and a lower peripheral pixel 126. A width of a light shield 150 of an adjacent side of each of the peripheral pixels may be adjusted to be smaller or greater than a reference width. The light shields 150 of the adjacent sides may have different widths.

FIGS. 38 to 41 are views taken along lines VII-VII', VIII-VIII', IX-IX', and X-X' of FIG. 37, each illustrating a cross-sectional structure of the unit pixel array according to an exemplary embodiment of the present disclosure.

Figure 38:
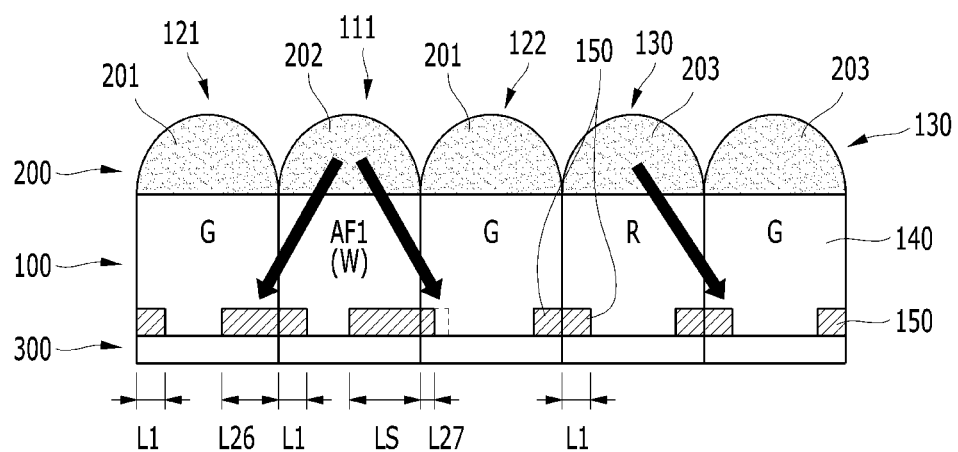
Figure 39:
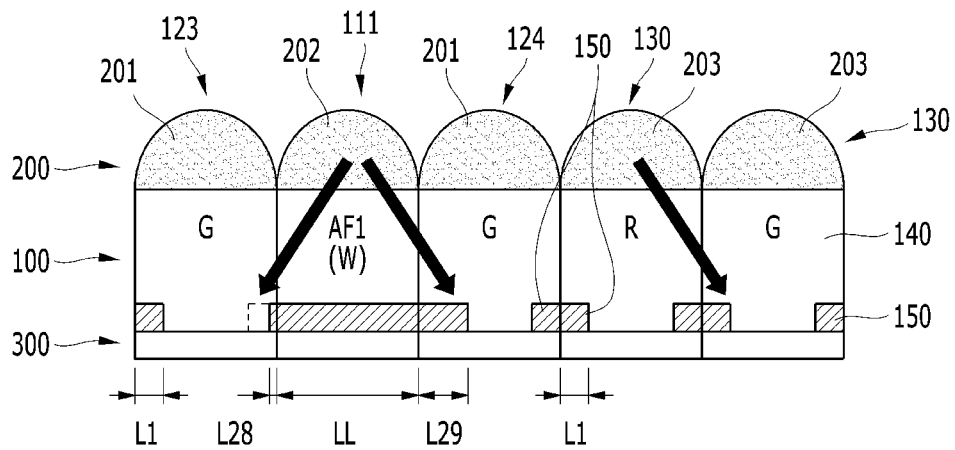

Referring to FIGS. 38 and 39, the light shield 150 may be formed to extend to a right side of the first phase-difference detection pixel 111. A width of a cross-section of the light shield 150 extending in the first phase-difference detection pixel 111 may be a width LS, and a width of a longitudinal section thereof may be a width LL. The width LL may have a size corresponding to a length of one side of one pixel.

Referring to FIG. 38, the width LS of the light shield 150 may be greater than a reference width L1. The first phase-difference detection pixel 111 may receive incident light through an opening formed at a left side thereof. The left peripheral pixel 121 disposed at the left side of the first phase-difference detection pixel 111 and having a G filter may be disposed close to the opening of the first phase-difference detection pixel 111, and thus, a light-receiving rate thereof may be increased. A width L26 of a light shield 150 of an adjacent side of the left peripheral pixel 121 may be greater than the reference width L1. As a result, a light-receiving rate of the left peripheral pixel 121 is the same as a light-receiving rate of a general pixel 130. The right peripheral pixel 122 disposed at a right side of the first phase-difference detection pixel 111 and having a G filter may be disposed in a direction opposite a direction toward the opening of the first phase-difference detection pixel 111, and thus, a light-receiving rate thereof may be decreased. A width L27 of a light shield of an adjacent side of the right peripheral pixel 122 may be smaller than the reference width L1. As a result, the light-receiving rate of the right peripheral pixel 122 is the same as the light-receiving rate of the general pixel 130.

Referring to FIG. 39, even when the upper peripheral pixel 123 and the lower peripheral pixel 124 of the first phase-difference detection pixel 111 include the same color filter 140, which is a G filter, widths L28 and L29 of the light shields 150 of adjacent sides thereof may be different. For example, the width L28 of the light shield 150 of the left peripheral pixel 121 may be smaller than the reference width L1, and the width L29 of the light shield 150 of the right peripheral pixel 122 may be greater than the reference width L1.

Figure 40:
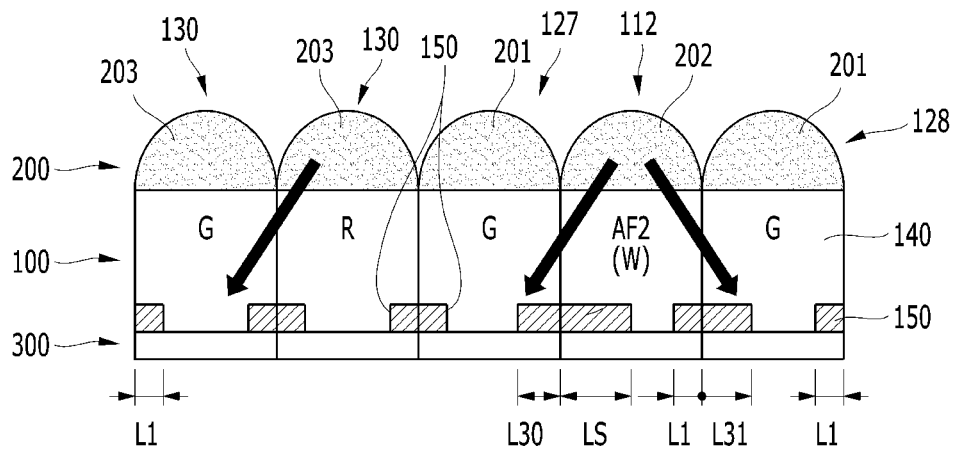

Referring to FIG. 40, the light shield 150 including a cross-section having the width LS may be formed to extend to a left side of the second phase-difference detection pixel 112. The second phase-difference detection pixel 112 may receive incident light through an opening formed at a right side thereof. Widths L30 and L31 of light shields 150 of different adjacent sides of the left peripheral pixel 121 and the right peripheral pixel 122 disposed at left and right sides of the second phase-difference detection pixel 112 and having G filters may be different.

Figure 41:
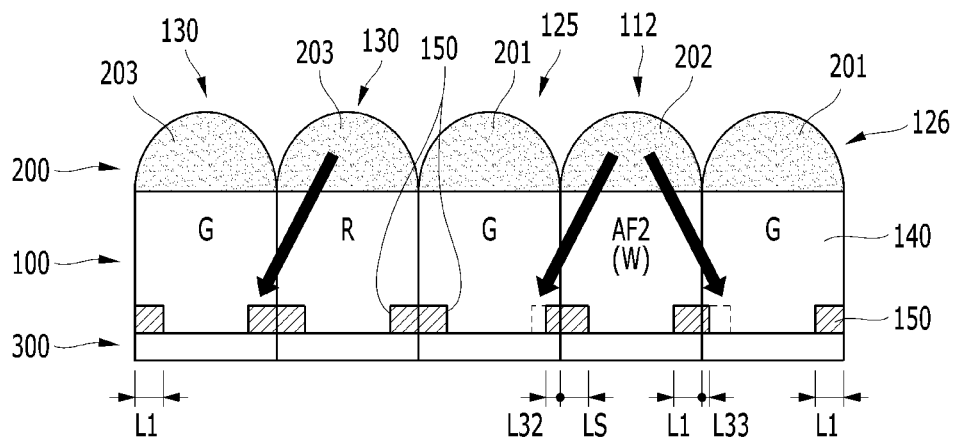

Referring to FIG. 41, widths L32 and L33 of the light shields 150 of adjacent sides of the upper peripheral pixel 125 and the lower peripheral pixel 126 of the second phase-difference detection pixel 112 may also be different.

Figure 42:
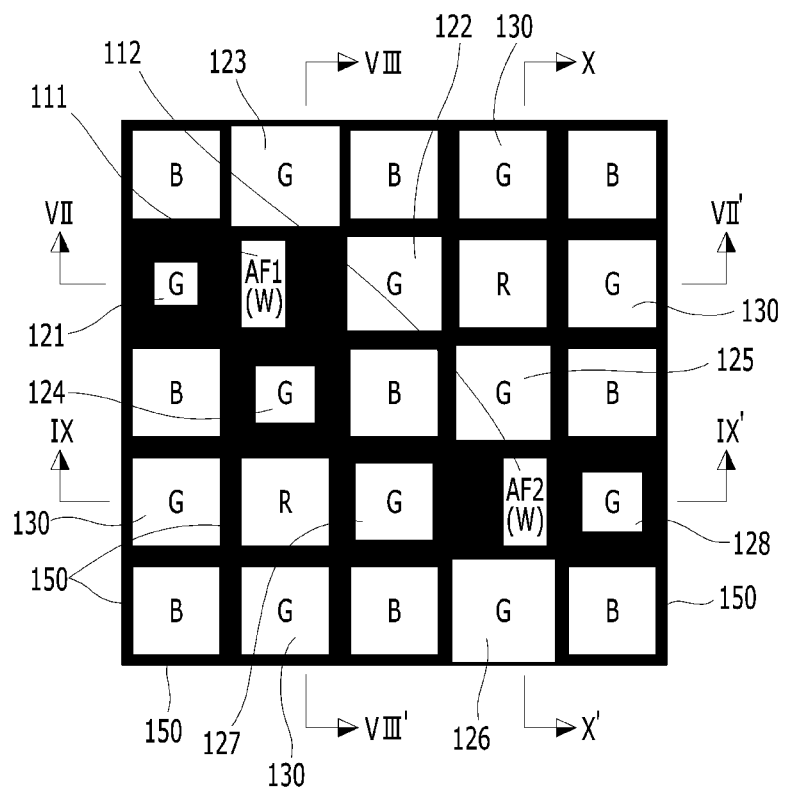

FIG. 42 is a view illustrating a unit pixel array according to an exemplary embodiment of the present disclosure.

The exemplary embodiment of FIG. 42 has the same locations and structures of the phase-difference detection pixels 111 and 112 as the exemplary embodiment of FIG. 37, except that widths of light shields 150 of all four sides of a peripheral pixel (e.g., a peripheral pixel from among peripheral pixels 121-128), which include adjacent sides, are varied. For example, the widths of light shields 150 of all of the four sides of a peripheral pixel (e.g., a peripheral pixel from among peripheral pixels 121-128) including the adjacent sides may be varied. When the widths of the light shields 150 of all of the four sides are adjusted, the widths of the light shields 150 extending toward an opening range corresponding to a center portion of the peripheral pixel (e.g., a peripheral pixel from among peripheral pixels 121-128) may be decreased. A dispersion characteristic of a light-receiving rate may be improved more than that of a case in which only the width of the light shield 150 of the adjacent side is adjusted.

Referring to FIG. 42, pixels disposed at right, left, upper, and lower sides of the first phase-difference detection pixel 111 and the second phase-difference detection pixel 112 may refer to peripheral pixels. For example, pixels 121-128 may be peripheral pixels. The peripheral pixels may have a light-receiving rate different from that of a general pixel 130 according to an opening direction or light-receiving rate of adjacent phase-difference detection pixels 111 and 112, wavelengths of color filters 140 included in the peripheral pixels (e.g. pixels 121-128), sizes and shapes of microlenses disposed on the pixels, etc. The width of the light shield 150 of each of the peripheral pixels (e.g., pixels 121-128) may be adjusted to have the same light-receiving rate as that of the general pixel 130 including a color filter 140 having the same wavelength as a wavelength of the color filter 140 in each of the peripheral pixels (e.g., pixels 121-128). The widths of the light shields 150 at the four sides of each of the peripheral pixels (e.g., pixels 121-128) may be varied together, and the varied widths of the light shields 150 at the four sides may be different. The widths of the light shields 150 at the four sides of the peripheral pixel (e.g., a pixel from among peripheral pixels 121-128) may be different for each of the peripheral pixels 121-128.

According to an exemplary embodiment of the present disclosure, the peripheral pixels may include four pixels adjacent to the phase-difference detection pixels 111 and 112 in a diagonal direction in addition to including the pixels at the right, left, upper, and lower sides of the phase-difference detection pixels 111 and 112. For example, referring to FIG. 42, a pixel having a B filter at a third row and a third column of the pixel unit array may be a common peripheral pixel of the first phase-difference detection pixel 111 and the second phase-difference detection pixel 112. Widths of light shields 150 of peripheral pixels having a light-receiving rate affected by two or more phase-difference detection pixels may also be varied from a reference width so that the light-receiving rate of the peripheral pixels is the same as the light-receiving rate of the general pixel 130 having the same color filter 140.

According to an exemplary embodiment of the present disclosure, the light-receiving rate of the peripheral pixel may be affected by adjusting widths of light shields 150 of other peripheral pixels other than the phase-difference detection pixel adjacent thereto. The width of the light shield 150 of the peripheral pixel may be adjusted according to the phase-difference detection pixel adjacent thereto and a change in total light-receiving rate due to the other peripheral pixels.

FIGS. 43 to 46 are views taken along lines VII-VII', VIII-VIII', IX-IX', and X-X' of FIG. 42, each illustrating a cross-sectional structure of the unit pixel array according to an exemplary embodiment of the present disclosure.

Figure 43:
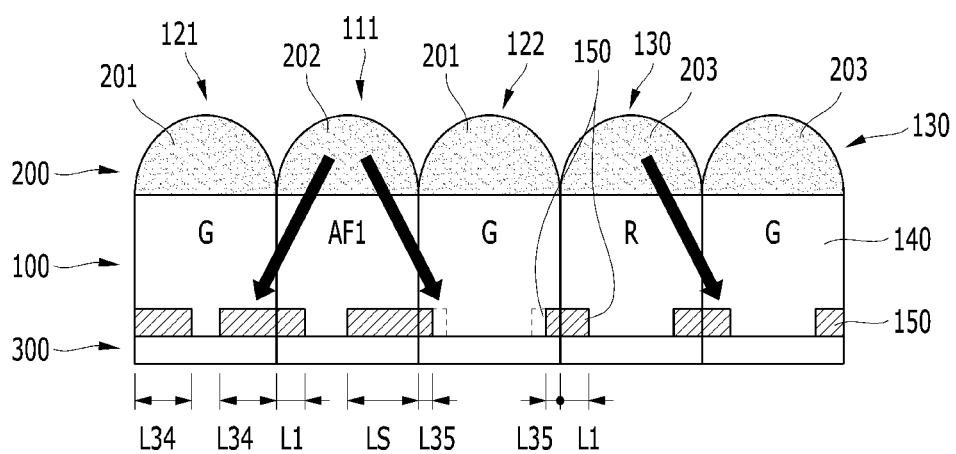

Referring to FIG. 43, widths L34 of the light shields 150 at the four sides of the left peripheral pixel 121 of the first phase-difference detection pixel 111 may be different from widths L35 of the light shields 150 at the four sides of the right peripheral pixel 122. The width L34 of the light shield 150 of the left peripheral pixel 121 may be greater than a reference width L1, and the width L35 of the light shield 150 of the right peripheral pixel 122 may be smaller than the reference width L1.

Figure 44:
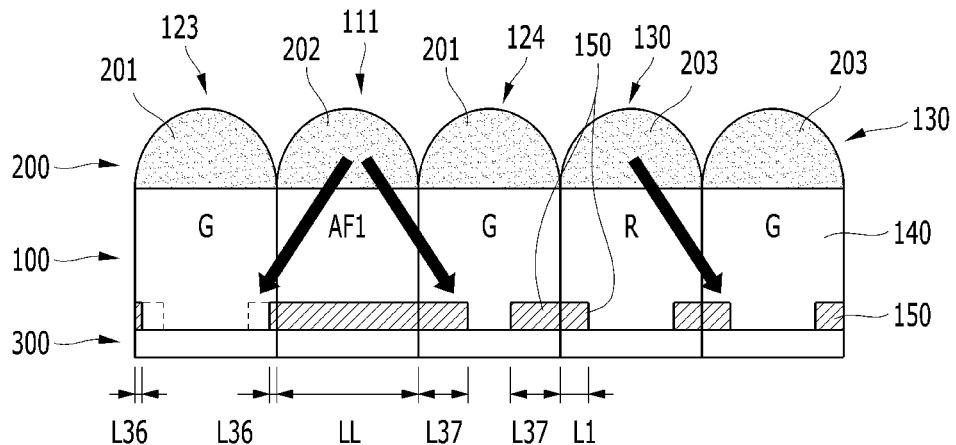

Referring to FIG. 44, widths L36 and L37 of the light shields 150 at the four sides of each of the upper peripheral pixel 123 and the lower peripheral pixel 124 of the first phase-difference detection pixel 111 may be different.

Figure 45:
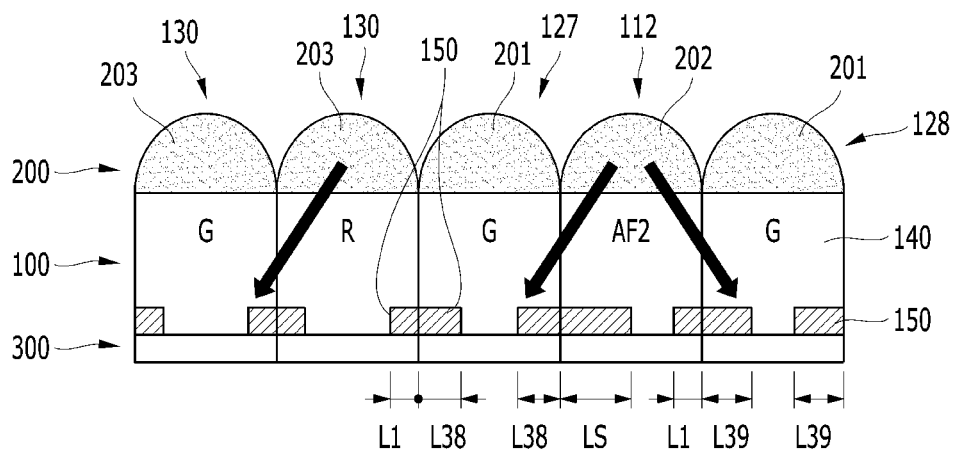

Referring to FIG. 45, widths L38 and L39 of the light shields 150 at the four sides of each of the left peripheral pixel 127 and the right peripheral pixel 128 of the second phase-difference detection pixel 112 may be different.

Figure 46:
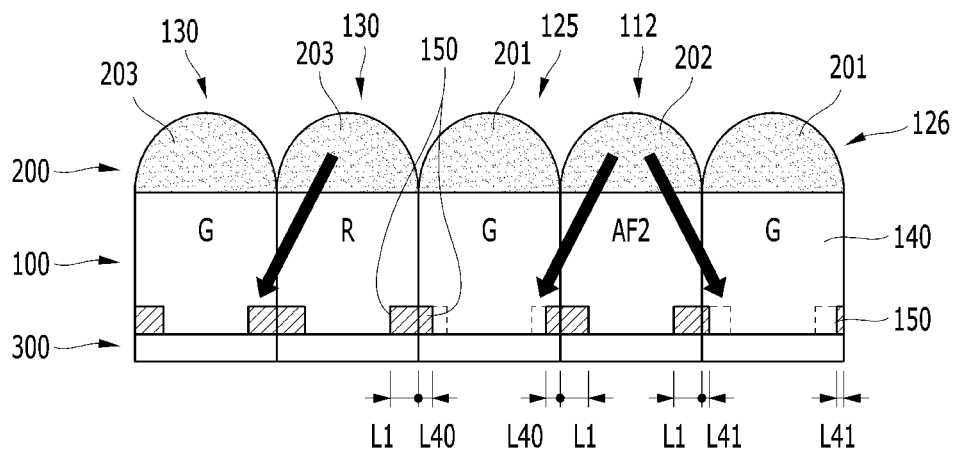

Referring to FIG. 46, widths L40 and L41 of the light shields of the four sides of each of the upper peripheral pixel 125 and the lower peripheral pixel 126 of the second phase-difference detection pixel 112 may be different. In addition, like the exemplary embodiment of FIG. 33, the widths of the light shields 150 at the four sides of one peripheral pixel may also be different.

Figure 47:
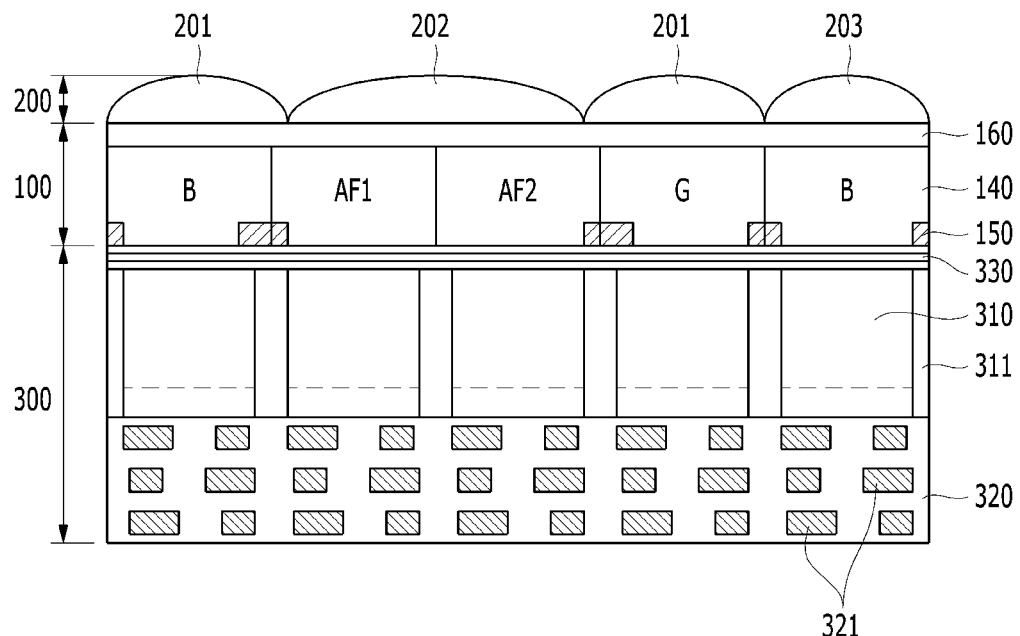
Figure 48:
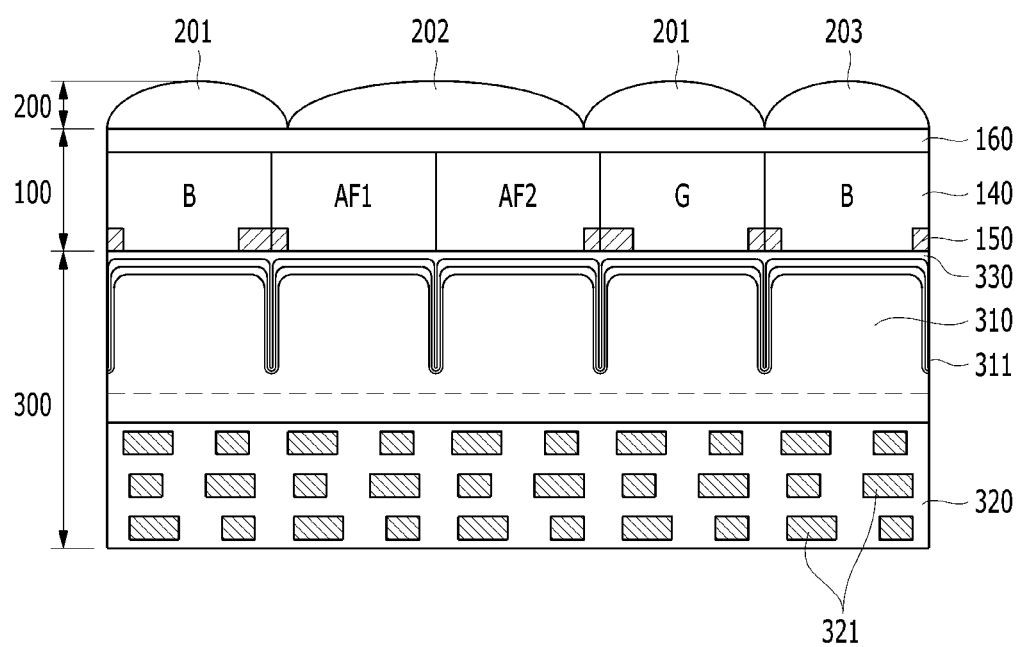

FIGS. 47 and 48 are views each illustrating a cross-sectional structure of a unit pixel array according to an exemplary embodiment of the present disclosure.

The unit pixel array may sequentially include a photoelectric transformation layer 300, a color filter layer 100 disposed on the photoelectric transformation layer 300, and a microlens layer 200 disposed on the color filter layer 100. The unit pixel array in FIGS. 47 and 48 has a backside illuminated (BSI) structure in which rear surfaces of photodiodes 310 are disposed facing the microlens layer 200.

Referring to FIG. 47, the photoelectric transformation layer 300 may include an insulating interlayer 320 in a lower portion thereof and the photodiodes 310 in an upper portion thereof. Interconnections 321 are included in the insulating interlayer 320, and the photodiodes 310 are divided by device separation films 311 in units of pixels. The device separation film 311 is a front-side deep trench isolation (FDTI) film in which a trench formed from a front side of the photodiode to a rear side thereof is buried. A light transmission layer 330 may be formed on the photoelectric transformation layer 300. The color filter layer 100 including light shields 150 and color filters 140 may be formed on the light transmission layer 330. A planarization layer 160 may be formed on the color filters 140. The microlens layer 200 may be formed on the color filter layer 100 and include microlenses 201, 202, and 203 at locations corresponding to the color filters 140.

The exemplary embodiment of FIG. 48 corresponds to the exemplary embodiment of FIG. 47, and a device separation film 311 is a back-side deep trench isolation (BDTI) film in which a trench formed from a rear surface of a photodiode 310 to a front surface thereof is buried.

FIGS. 49 to 54 are cross-sectional views illustrating a method of manufacturing a unit pixel array according to an exemplary embodiment of the present disclosure. A method of manufacturing a unit pixel array of an image sensor having the FDTI structure shown in FIG. 47 will be described with reference to FIGS. 49 to 54, but exemplary embodiments of the present disclosure are not limited thereto.

Figure 49:
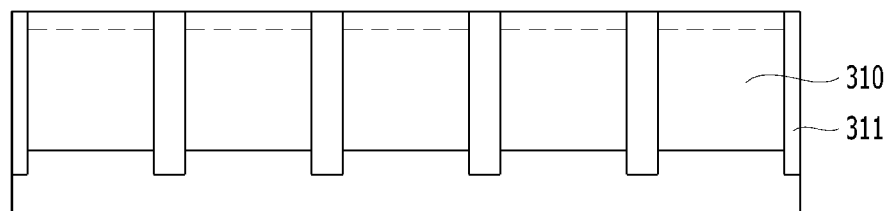
FIGS. 49 to 54 are cross-sectional views illustrating a method of manufacturing a unit pixel array according to an exemplary embodiment of the present disclosure.

Referring to FIG. 49, photodiodes 310 and device separation films 311 are formed on a substrate. The device separation films 311 are formed to be adjacent to a front surface of the substrate and spaced apart from a rear surface of the substrate.

Figure 50:
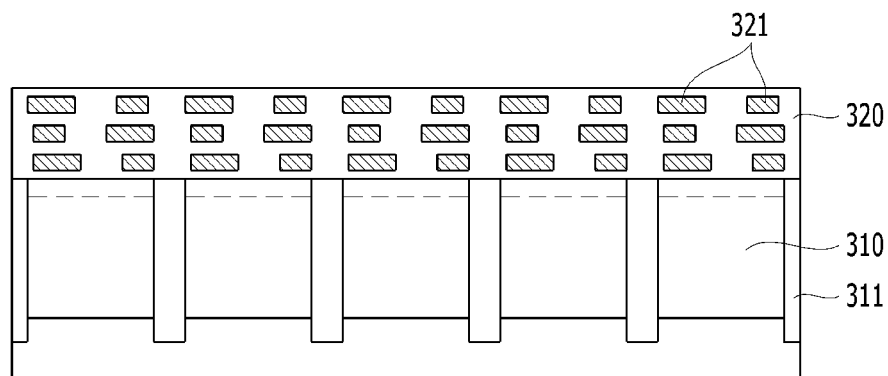

Referring to FIG. 50, an insulating interlayer 320 is formed on the front surface of the substrate, and transistors and interconnections 321 are formed inside the insulating interlayer 320. A photoelectric transformation layer 300 may be formed by forming the insulating interlayer 320 on the substrate including the photodiode 310.

Figure 51:
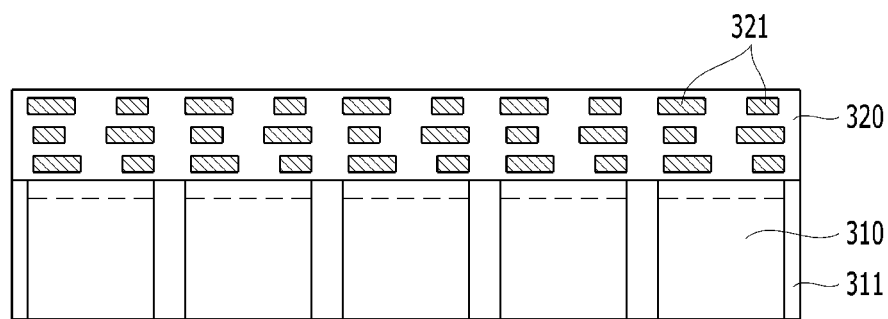

Referring to FIG. 51, a back grinding process is performed on the rear surface of the substrate on which the insulating interlayer 320 is formed. In this case, the device separation films 311 may be exposed.

Figure 52:
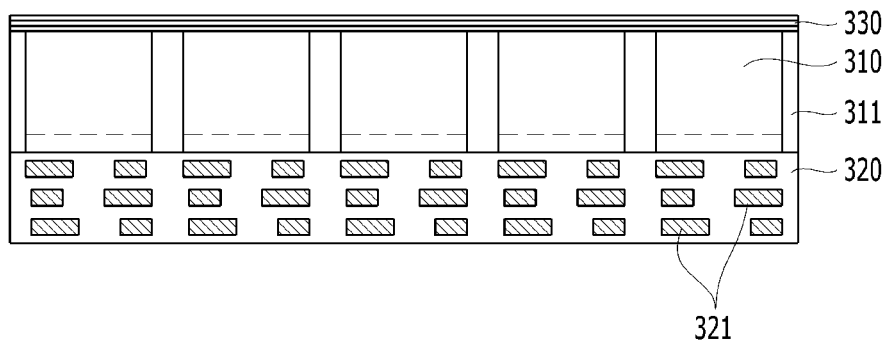

Referring to FIG. 52, the substrate on which the insulating interlayer 320 is formed is turned over, and a light transmission layer 330 is formed on the rear surface thereof on which the back grinding process is performed. The light transmission layer 330 may be a single layer or multilayer. For example, the light transmission layer 330 may be formed to have a three-layered structure including an $Al_2O_3$ layer, a $SiO_2$ layer, and a HfO layer.

Figure 53:
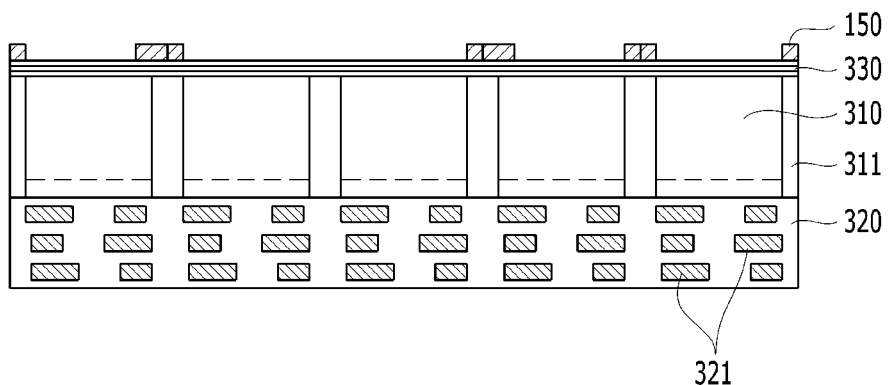

Referring to FIG. 53, a light shield 150 may be formed on the light transmission layer 330. The light shield 150 may or may not be formed according to a characteristic of a pixel, and a width thereof may also be changed.

Figure 54:
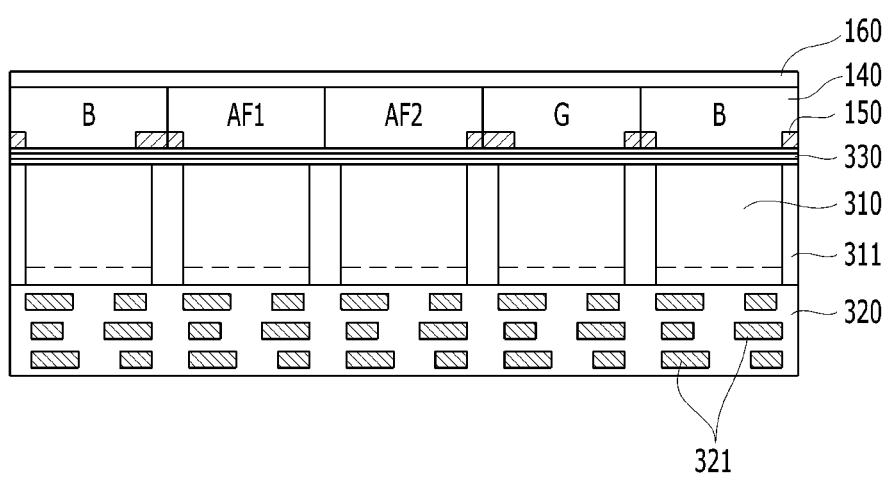

Referring to FIG. 54, each pixel is filled with a color filter 140 such as an R filter, a G filter, a B filter, a W filter, etc., and a planarization layer 160 is formed on the color filter. Thus, a color filter layer 100 including the light shield 150, the color filter 140, and the planarization layer 160 may be formed. After the color filter layer 100 is formed, a microlens layer 200 corresponding to each pixel may be formed on the color filter layer 100.

Figure 55:
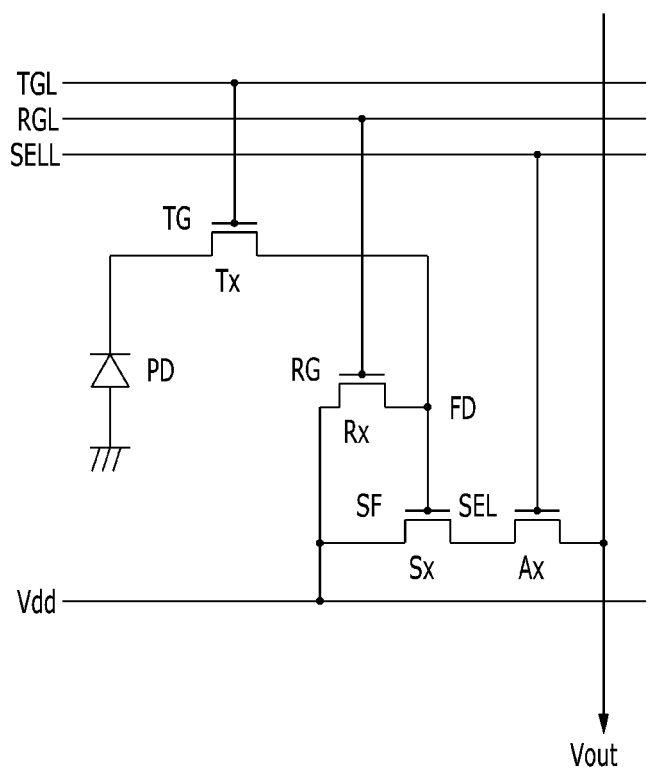
FIG. 55 is an equivalent circuit diagram of a unit pixel according to an exemplary embodiment of the present disclosure.

FIG. 55 is an equivalent circuit diagram of a unit pixel according to an exemplary embodiment of the present disclosure.

Referring to FIG. 55, each of photoelectric transformation layers 300 of the unit pixel may include a photoelectric transformation range PD, a transfer transistor Tx, a source follow transistor Sx, a reset transistor Rx, and a select transistor Ax.

The transfer transistor Tx, the source follow transistor Sx, the reset transistor Rx, and the select transistor Ax respectively include a transfer gate TG, a source follow gate SF, a reset gate RG, and a select gate SEL.

The transfer gate TG of the unit pixel may be electrically connected to a transfer gate line TGL. The reset gate RG of the unit pixel may be electrically connected to a reset gate line RGL. The select gate SEL of the unit pixel may be electrically connected to a select gate line SELL.

The photoelectric transformation range PD may be a photodiode including an N-type impurity range/region and a P-type impurity range/region. A drain of the transfer transistor Tx may refer to a floating diffusion range FD. The floating diffusion range FD may be a source of the reset transistor Rx. The floating diffusion range FD may be electrically connected to the source follow gate SF of the source follow transistor Sx. The source follow transistor Sx may be connected to the select transistor Ax. The transfer transistor Tx and the source follow transistor Sx may be connected to voltage Vdd, and the select transistor Ax may be connected to voltage Vout.

According to exemplary embodiments of the present disclosure, a signal difference between general pixels and peripheral pixels adjacent to phase-difference detection pixels can be compensated for, and thus, quality degradation of an image can be prevented or reduced.

In addition, according to exemplary embodiments of the present disclosure, a function of adjusting a focus of an image sensor can be improved by adjusting sizes of microlenses without changing a light-receiving rate of peripheral pixels.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. An image sensor, comprising:
  a first phase-difference detection pixel and a second phase-difference detection pixel directly adjacent to the first phase-difference detection pixel in a first direction;
  a first general pixel spaced apart from the first and second phase-difference detection pixels in the first direction;

a first peripheral pixel adjacent to the first phase-difference detection pixel in the first direction and disposed between the first phase-difference detection pixel and the first general pixel in the first direction;

a single microlens disposed over the first phase-difference detection pixel and the second phase-difference pixels;

a first microlens disposed over the first general pixel;

a second microlens disposed over the first peripheral pixel;

a first light shield between the first phase-difference detection pixel and the first peripheral pixel and having a first width; and a second light shield between the first peripheral pixel and the first general pixel and having a second width different from the first width, wherein there is no light shield between the first phase-difference detection pixel and the second phase-difference detection pixel.

2. The image sensor of claim 1, further comprising:

a second peripheral pixel adjacent to the first phase-difference detection pixel in a second direction perpendicular to the first direction; and a third peripheral pixel adjacent to the second phase-difference detection pixel in the second direction, wherein the single microlens expands to overlap a space between the second and the third peripheral pixels.

3. The image sensor of claim 1, wherein a width of the single microlens in a direction perpendicular to the first direction at an edge of the single microlens is shorter than a width of the single microlens in a direction perpendicular to the first direction at a center of the single microlens, wherein the edge of the single microlens is in contact with the second microlens.

4. The image sensor of claim 1, wherein a maximum length of the single microlens in the first direction is longer than maximum lengths of the first microlens and the second microlens in the first direction.

5. The image sensor of claim 4, wherein the maximum length of the second microlens in the first direction is longer than the maximum length of the first microlens in the first direction.

6. The image sensor of claim 4, further comprising:

a first color filter disposed under the single microlens;

a second color filter disposed under the first microlens; and a third color filter disposed under the second microlens, wherein the first color filter and the third color filter are green filters and the second color filter is one of a red filter or a blue filter.

7. The image sensor of claim 6, further comprising:

a light transmission layer formed under the first, second and third color filters and the first and second light shields, wherein the light transmission layer includes at least one of HfO or AlO.

8. The image sensor of claim 6, further comprising:

a first device separation film disposed under a boundary between the first phase-difference detection pixel and the second phase-difference detection pixel; and a second device separation film disposed under a boundary between first phase-difference detection pixel and the first peripheral pixel.

9. The image sensor of claim 8, wherein the first separation film partially divides a first portion of a photodiode under the first phase-difference detection pixel and the second phase-difference detection pixel, and wherein the second separation film partially divides a second portion of the photodiode under the first phase-difference detection pixel and the first peripheral pixel.

10. An image sensor, comprising:

a first phase-difference detection pixel and a second phase-difference detection pixel directly adjacent to the first phase-difference detection pixel in a first direction, the first and second phase-difference detection pixels being formed in a first row;

a first peripheral pixel adjacent to the first phase-difference detection pixel in a second direction perpendicular to the first direction;

a second peripheral pixel adjacent to the second phase-difference detection pixel in the second direction;

a third peripheral pixel adjacent to the first phase-difference detection pixel in the first direction;

a general pixel adjacent to the third peripheral pixel in the first direction;

a single microlens formed over the first and second phase-difference detection pixels;

a first light shield between the first phase-difference detection pixel and the third peripheral pixel and having a first width; and a second light shield between the third peripheral pixel and the general pixel and having a second width different from the first width, wherein there is no light shield between the first phase-difference detection pixel and the second phase-difference detection pixel.

11. The image sensor of claim 10, further comprising:

a first microlens disposed over the first peripheral pixel and a second microlens disposed over the second peripheral pixel, wherein the single microlens expands toward a space between the first microlens and the second microlens in the second direction.

12. The image sensor of claim 11, further comprising:

a third microlens disposed over the third peripheral pixel and a fourth microlens disposed over the general pixel, wherein a length of the third microlens in the first direction is greater than a length of the fourth micro-lens in the first direction.

13. The image sensor of claim 11, wherein the first phase-difference detection pixel and the second phase-difference detection pixel correspond to a first green color filter.

14. The image sensor of claim 13, further comprising:

a fourth peripheral pixel adjacent to the first phase-difference detection pixel in the second direction; and a fifth peripheral pixel adjacent to the second phase-difference detection pixel in the second direction, wherein the third peripheral pixel corresponds to a second green color filter.

15. The image sensor of claim 14, wherein one of the first and the second peripheral pixels corresponds to a third green color filter, and wherein one of the fourth and the fifth peripheral pixels corresponds to a fourth green color filter.

16. The image sensor of claim 15, further comprising:

a device separation film partially dividing a photodiode under the first phase-difference detection pixel and the second phase-difference detection pixel.

17. The image sensor of claim 15, further comprising:
a device separation film fully dividing a photodiode under the first phase-difference detection pixel and the second phase-difference detection pixel.

18. An image sensor, comprising:
a first phase-difference detection pixel and a second phase-difference detection pixel directly adjacent to the first phase-difference detection pixel in a first direction;
a first peripheral pixel adjacent to the first phase-difference detection pixel in the first direction;
a second peripheral pixel adjacent to the second phase-difference detection pixel in the first direction;
a first light shield between the first phase-difference detection pixel and the first peripheral pixel;
a second light shield between the second phase-difference detection pixel and the second peripheral pixel,
wherein the first and second light shields are light shields adjacent to each other in the first direction, and
wherein a width of the first light shield in the first direction is different from a width of the second light shield in the first direction;
a general pixel adjacent to the first peripheral pixel in the first direction; and
a third light shield between the general pixel and the first peripheral pixel,
wherein a width of the third light shield in the first direction is different from the width of the first light shield in the first direction and the width of the second light shield in the first direction.

19. The image sensor of claim 18, further comprising:
a single microlens disposed over the first phase-difference detection pixel and the second phase-difference pixels; and
a first microlens disposed over the first peripheral pixel,
wherein a size of the single microlens is larger than a size of the first microlens.

* * * * *